US009934463B2

(12) United States Patent
Seo et al.

(10) Patent No.: US 9,934,463 B2
(45) Date of Patent: Apr. 3, 2018

(54) NEUROMORPHIC COMPUTATIONAL SYSTEM(S) USING RESISTIVE SYNAPTIC DEVICES

(71) Applicants: Jae-sun Seo, Tempe, AZ (US); Shimeng Yu, Tempe, AZ (US); Yu Cao, Gilbert, AZ (US); Sarma Vrudhula, Chandler, AZ (US)

(72) Inventors: Jae-sun Seo, Tempe, AZ (US); Shimeng Yu, Tempe, AZ (US); Yu Cao, Gilbert, AZ (US); Sarma Vrudhula, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/156,113

(22) Filed: May 16, 2016

(65) Prior Publication Data
US 2016/0336064 A1   Nov. 17, 2016

Related U.S. Application Data

(60) Provisional application No. 62/162,452, filed on May 15, 2015.

(51) Int. Cl.
*G11C 11/00* (2006.01)
*G06N 3/08* (2006.01)
(Continued)

(52) U.S. Cl.
CPC .............. *G06N 3/088* (2013.01); *G11C 11/54* (2013.01); *G11C 13/0002* (2013.01); *G11C 13/0069* (2013.01)

(58) Field of Classification Search
CPC .......... G11C 13/20002; G11C 13/0069; G11C 13/0004; G11C 13/0007
(Continued)

(56) References Cited

U.S. PATENT DOCUMENTS

2008/0205119 A1* 8/2008 Nagai ....................... G11C 7/02
365/148
2011/0211391 A1* 9/2011 Parkinson ............... G11C 11/56
365/163

(Continued)

OTHER PUBLICATIONS

Bell, Anthony J. et al., "The "Independent Components" of Natural Scenes are Edge Filters," Vision Research, vol. 37, No. 23, Dec. 1997, pp. 3327-3338.
(Continued)

*Primary Examiner* — Connie Yoha
(74) *Attorney, Agent, or Firm* — Withrow & Terranova, P.L.L.C.

(57) ABSTRACT

Neuromorphic computational circuitry is disclosed that includes a cross point resistive network and line control circuitry. The cross point resistive network includes variable resistive units. One set of the variable resistive units is configured to generate a correction line current on a conductive line while other sets of the variable resistive units generate resultant line currents on other conductive lines. The line control circuitry is configured to receive the line currents from the conductive lines and generate digital vector values. Each of the digital vector values is provided in accordance with a difference between the current level of a corresponding resultant line current and a current level of the correction line current. In this manner, the digital vector values are corrected by the current level of the correction line current in order to reduce errors resulting from finite on to off conductance state ratios.

11 Claims, 14 Drawing Sheets

(51) Int. Cl.
*G11C 11/54* (2006.01)
*G11C 13/00* (2006.01)

(58) Field of Classification Search
USPC .................................. 365/148, 63, 174, 163
See application file for complete search history.

(56) References Cited

U.S. PATENT DOCUMENTS

| | | | | |
|---|---|---|---|---|
| 2013/0107605 | A1* | 5/2013 | Chen .................. | G11C 13/0002 365/148 |
| 2015/0091859 | A1* | 4/2015 | Rosenberg ............. | G06F 3/044 345/174 |
| 2015/0347896 | A1* | 12/2015 | Roy ........................ | G11C 11/16 365/148 |
| 2016/0049195 | A1* | 2/2016 | Yu ...................... | G11C 13/0026 365/63 |

OTHER PUBLICATIONS

Chang, Chih-Chung et al., "LIBSVM: A Library for Support Vector Machines," ACM Transactions on Intelligent Systems and Technology, vol. 2, No. 3, Article 27, Apr. 2011, 27 pages.

Hasler, Jennifer et al., "Finding a roadmap to achieve large neuromorphic hardware systems," Frontiers in Neuroscience, vol. 7, Article 118, Sep. 10, 2013, 29 pages.

Hubel, D. H. et al., "Receptive Fields, Binocular Interaction and Functional Architecture in the Cat's Visual Cortex," The Journal of Physiology, vol. 160, No. 1, 1962, pp. 106-155.

Hu, Miao et al., "Memristor Crossbar Based Hardware Realization of BSB Recall Function," WCCI 2012 IEEE World Congress on Computational Intelligence, Jun. 10-15, 2012, Brisbane, Australia, 7 pages.

Jin, Xin et al., "Modeling Spiking Neural Networks on SpiNNaker," Computing in Science and Engineering, vol. 12, No. 5, Sep. 1, 2010, pp. 91-97.

Jo, Sung Hyun et al., "Nanoscale Memristor Device as Synapse in Neuromorphic Systems," Nano Letters, vol. 10, No. 4, Apr. 14, 2010, pp. 1297-1301.

Kuzum, Duygu et al., "Synaptic electronics: materials, devices and applications," Nanotechnology, vol. 24, No. 38, Sep. 2, 2013, 22 pages.

Lecun, Yann et al., "The MNIST database of handwritten digits," 1998, 6 pages, Date Accessed: Aug. 31, 2016, http://yann.lecun.com/exdb/mnist/.

Lee, Honglak et al., "Efficient sparse coding algorithms," Advances in neural information processing systems, 2006, pp. 801-808.

Mahalanabis, Debayan, "Multilevel Resistance Programming in Conductive Bridge Resistive Memory," Dissertation, Arizona State University, Dec. 2015, 169 pages.

Mandal, Saptarshi et al., "Novel synaptic memory device for neuromorphic computing," Scientific Reports, vol. 4, Jun. 18, 2014, 10 pages.

Merolla, Paul A. et al., "A million spiking-neuron integrated circuit with a scalable communication network and interface," Science, vol. 345, No. 6197, Aug. 8, 2014, pp. 668-673.

Mnatzaganian, James et al., "Memristors and Neuromorphic Computing," PowerPoint presentation, Nov. 13, 2012, 29 pages.

Park, S. et al., "Neuromorphic Speech Systems using Advanced ReRAM-based Synapse," IEDM Tech Digest, vol. 25, Dec. 9, 2013, 4 pages.

Partzsch, Johannes et al., "Analyzing the Scaling of Connectivity in Neuromorphic Hardware and in Models of Neural Networks," IEEE Transactions on Neural Networks, vol. 22, No. 6, Jun. 2011, pp. 919-935.

Schemmel, Johannes et al., "A Wafer-Scale Neuromorphic Hardware System for Large-Scale Neural Modeling," Proceedings of 2010 IEEE International Symposium on Circuits and Systems, May 30-Jun. 2, 2010, IEEE, pp. 1947-1950.

Serrano-Gotarredona, Rafael et al., "CAVIAR: A 45k Neuron, 5M Synapse, 12G Connects/s AER Hardware Sensory—Processing—Learning—Actuating System for High-Speed Visual Object Recognition and Tracking," IEEE Transactions on Neural Networks, vol. 20, No. 9, Sep. 2009, pp. 1417-1438.

Shevgoor, Manjunath et al., "Improving Memristor Memory with Sneak Current Sharing," Proceedings of the 33rd IEEE International Conference on Computer Design, ICCD 2015, Dec. 14, 2015, 8 pages.

Sun, Jeff, "CMOS and Memristor Technologies for Neuromorphic Computing Applications," Electrical Engineering and Computer Sciences University of California at Berkeley, Technical Report No. UCB/EECS-2015-219, Dec. 1, 2015, 31 pages.

\* cited by examiner (1) $\quad E = \min \sum (\|DZ-x\|^2 + \lambda \|Z\|_1)$ (2) $\quad D \leftarrow D - \eta R Z^T \quad (R = DZ - x)$ (3) $\quad G_{LTP} = B\left(1 - e^{\left(-\frac{P}{A}\right)}\right) + G_{min}$ (4) $\quad G_{LTD} = -B\left(1 - e^{\left(\frac{P - P_{max}}{A}\right)}\right) + G_{max}$ (5) $\quad B = \dfrac{G_{max} - G_{min}}{1 - e^{\frac{-P_{max}}{A}}}$ (6) $\quad P_D(n \rightarrow n+1) = P_i * e^{\left(\frac{m \times n}{50}\right)} \quad m = \begin{cases} 6, & LTP \\ 4, & LTD \end{cases}$

FIG. 4

NEUROMORPHIC COMPUTATIONAL SYSTEM(S) USING RESISTIVE SYNAPTIC DEVICES

RELATED APPLICATIONS

This application claims the benefit of provisional patent application Ser. No. 62/162,452, filed May 15, 2015, which is hereby incorporated herein by reference in its entirety.

FIELD OF THE DISCLOSURE

This disclosure relates generally to neuromorphic computational circuitry along with systems and methods of operating the same.

BACKGROUND

Neuromorphic computing has gained great attention as the traditional Boolean computing based on CMOS technology is reaching its physical limits. Inspired by the computational capability of the human brain, cognitive computing and learning has become an increasingly attractive paradigm for future computation beyond the von Neumann architecture. Recent advances in neuro-inspired machine learning algorithms have shown tremendous success in speech/image recognition.

To implement large scale neuromorphic computing, large resistive networks of resistive devices are provided where the resistive devices have conductances that can be provided in multiple conductance states. Building these resistive networks with emerging non-volatile resistive devices is attractive as these non-volatile resistive devices tend to be more compact and less costly. However, current neuromorphic computational systems assume that the conductances of the non-volatile resistive devices can be changed linearly using identical voltage pulses. For many applications, this assumption is not justified and can result in unacceptably computational inaccuracy. One source of non-linearity is that an off conductance state of the resistive devices is not zero. Ideally, an on conductance state to off conductance state ratio (ON/OFF ratio) is infinite and in practice can be assumed to be infinite if the ON/OFF ratio is sufficiently high. Unfortunately, resistive devices typically have ON/OFF ratios of between 15 and 40 depending on the type of resistive devices being utilized in the resistive network. Thus, while current neuromorphic computational systems assume that the ON/OF conductance ratio is infinite, an ON/OFF ratio of between 15 and 40 is not sufficient to allow the neuromorphic computational systems to operate under this assumption because the non-linearity leads to unacceptably high computational errors. Therefore, new techniques are needed that can ameliorate the effect of finite ON/OFF ratios and thereby provide better computational accuracy in a neuromorphic computational system.

SUMMARY

This disclosure relates generally to neuromorphic computational circuitry along with systems and methods of operating the same. In one embodiment, neuromorphic computational circuitry includes a cross point resistive network and line control circuitry. The cross point resistive network has variable resistive units and a set of conductive lines. Sets of the variable resistive units are connected to a corresponding conductive line. One of the sets of the variable resistive units is configured to generate a correction line current along its corresponding conduction line while other sets of the variable resistive elements may be coupled to generate resultant line currents on their corresponding conductive lines.

For example, in one implementation, the cross point resistive network is arranged so that the variable resistive units are provided in columns where each column of the variable resistive units is connected to a corresponding conductive line of the set of conductive lines. One of the columns of the variable resistive units is configured to generate the correction line current while the other columns of the variable resistive elements are configured to generate resultant line currents on their respective conductive lines. The resultant line currents each have a current level that represents a vector value.

In one implementation, the set of variable resistive units that provides the correction line current is configured to generate the correction line current by providing each of the variable resistive units in this set of resistive units in a minimum conductance state (i.e. the off conductance state).

The line control circuitry is coupled to receive the correction line current and the resultant line currents from the set of conductive lines. The line control circuitry is configured to generate digital vector values. Each of the digital vector values is set in accordance with a difference between the current level of a corresponding one of the resultant line currents and a current level of the correction line current. In this manner, the digital vector values are corrected by the current level of the correction line current and thus computational errors resulting from a finite ON/OFF ratio are reduced or even substantially eliminated.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 illustrates equations relevant to operations for performing neuromorphic algorithms with the neuromorphic computational circuitry shown in FIG. 1.

Figure 1:
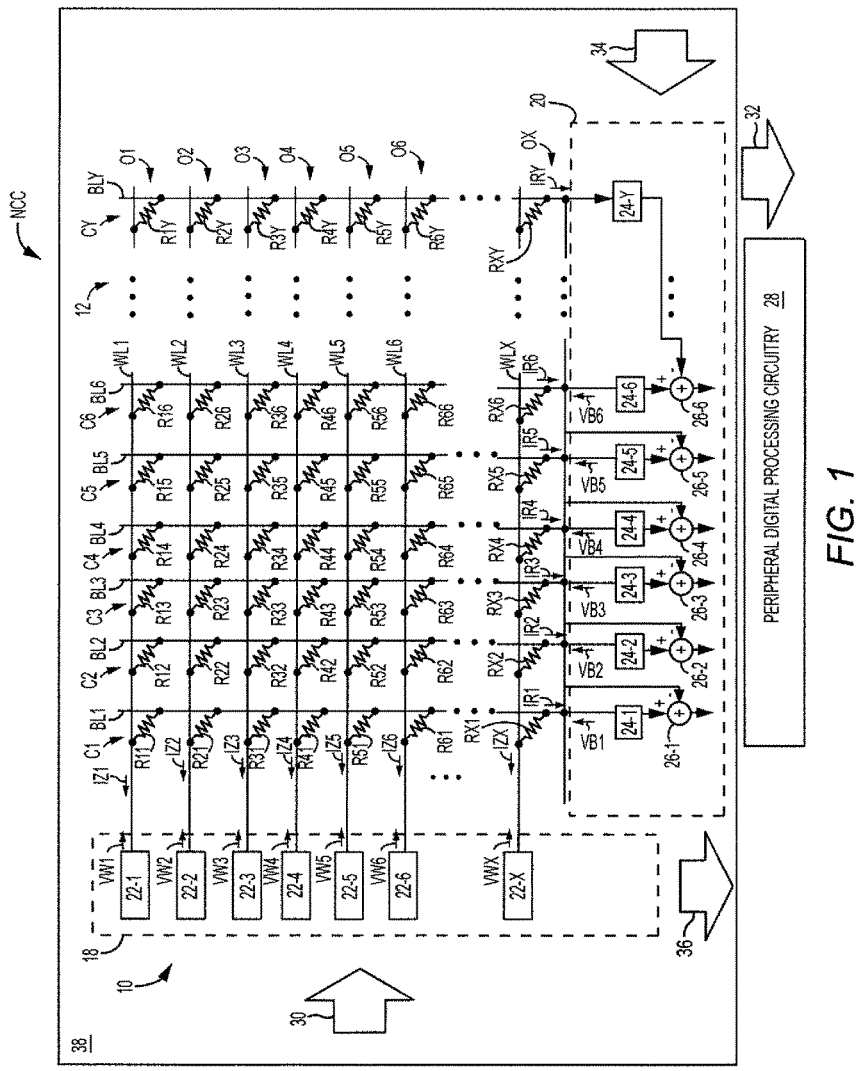
FIG. 1 illustrates an exemplary embodiment of neuromorphic computational circuitry, which includes an exemplary embodiment of a cross point resistive network that provides each variable resistive unit as a single variable resistive element and corrects for a finite on to off conductance state ratio.
Figure 5A:
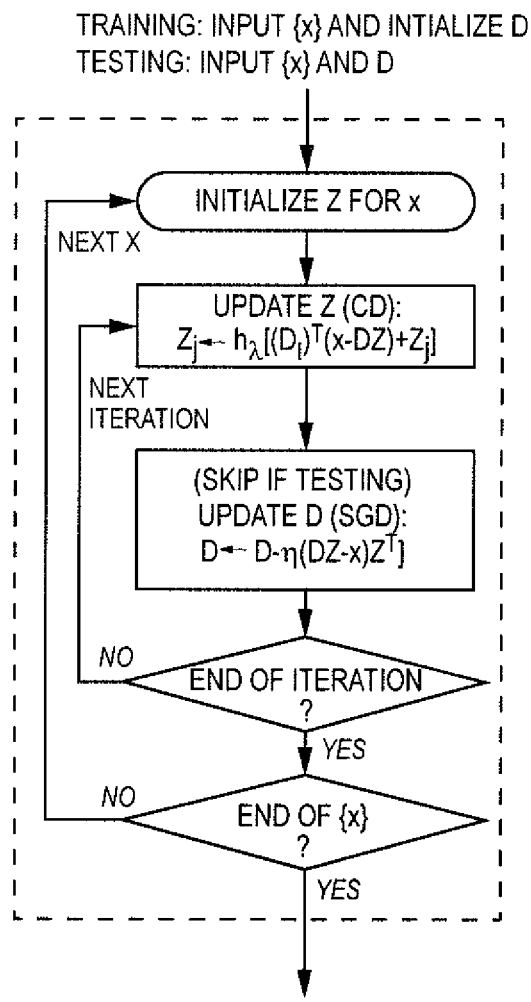
FIG. 5A illustrates exemplary steps in a sparse coding algorithm that may be performed by the neuromorphic computational circuitry shown in FIG. 1.
Figure 5B:
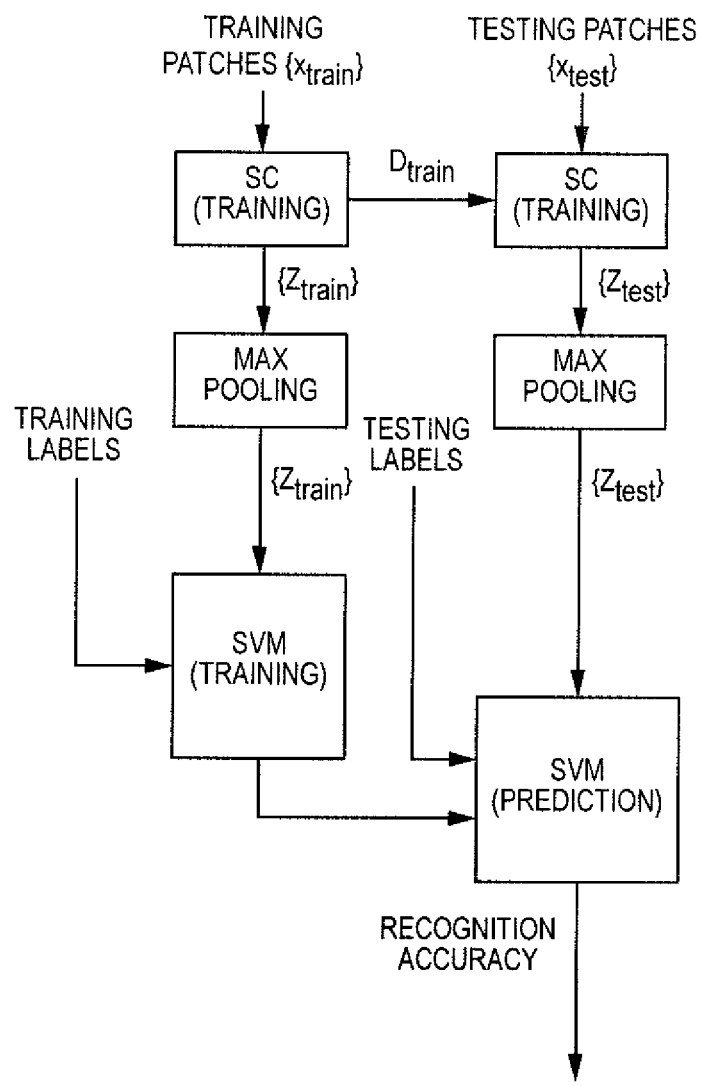

FIG. 5B describes a process flow that includes dictionary learning (training phase) and classification (testing phase) which may be performed by the neuromorphic computational circuitry shown in FIG. 1.

Figure 6:
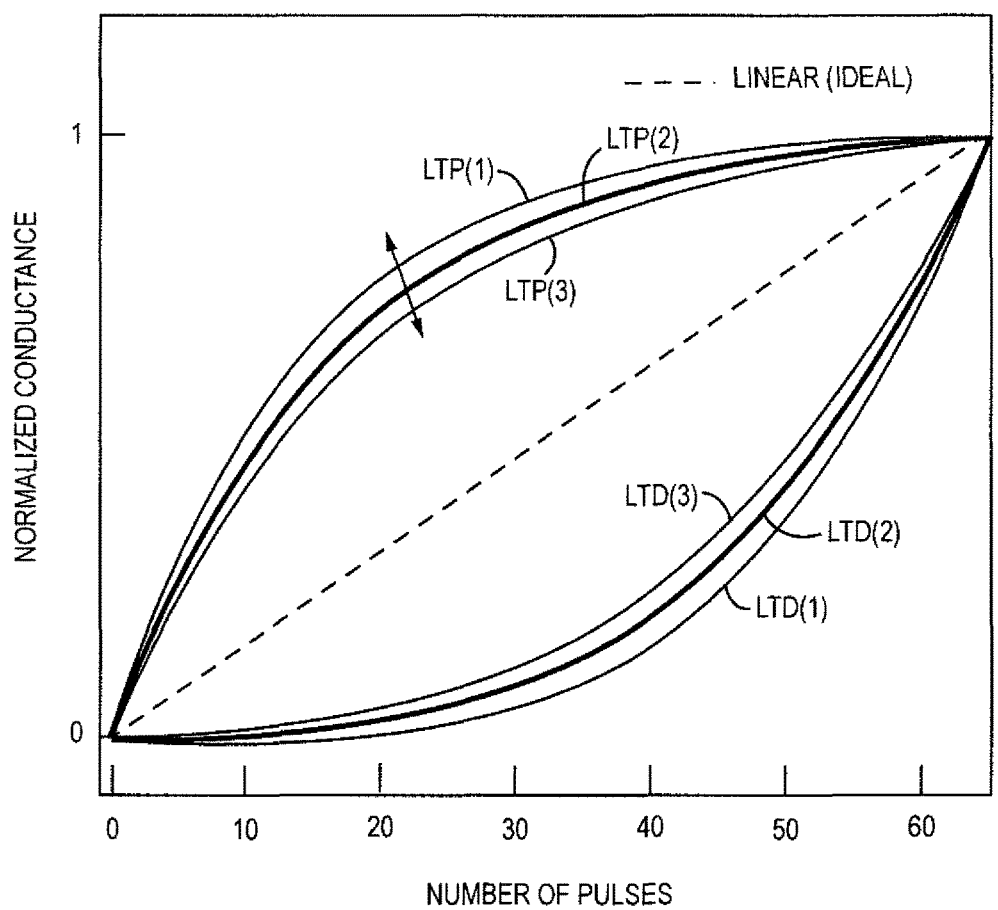
Figure 7A:
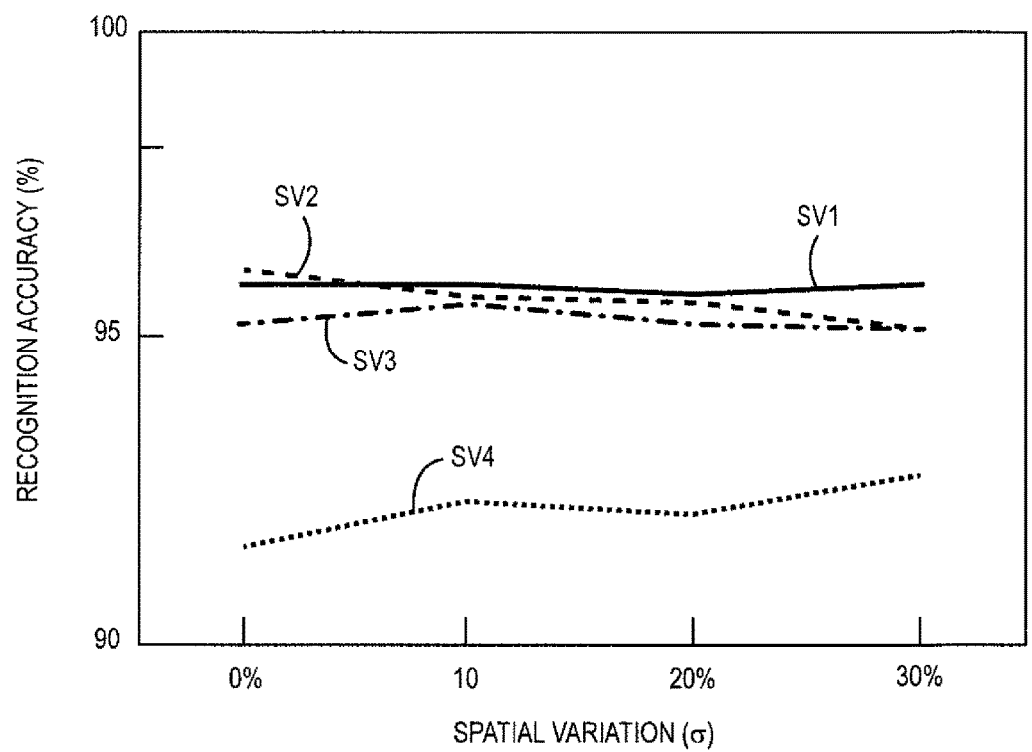

FIG. 6 illustrates curves describing the relationship between the variable conductance of one of the variable resistive elements shown in FIG. 1 as a function of an integer number identifying conductance states FIG. 7A illustrates curves that graph recognition accuracy versus the standard deviation of the variable conductance of one of the variable resistive elements shown in FIG. 1.

Figure 7B:
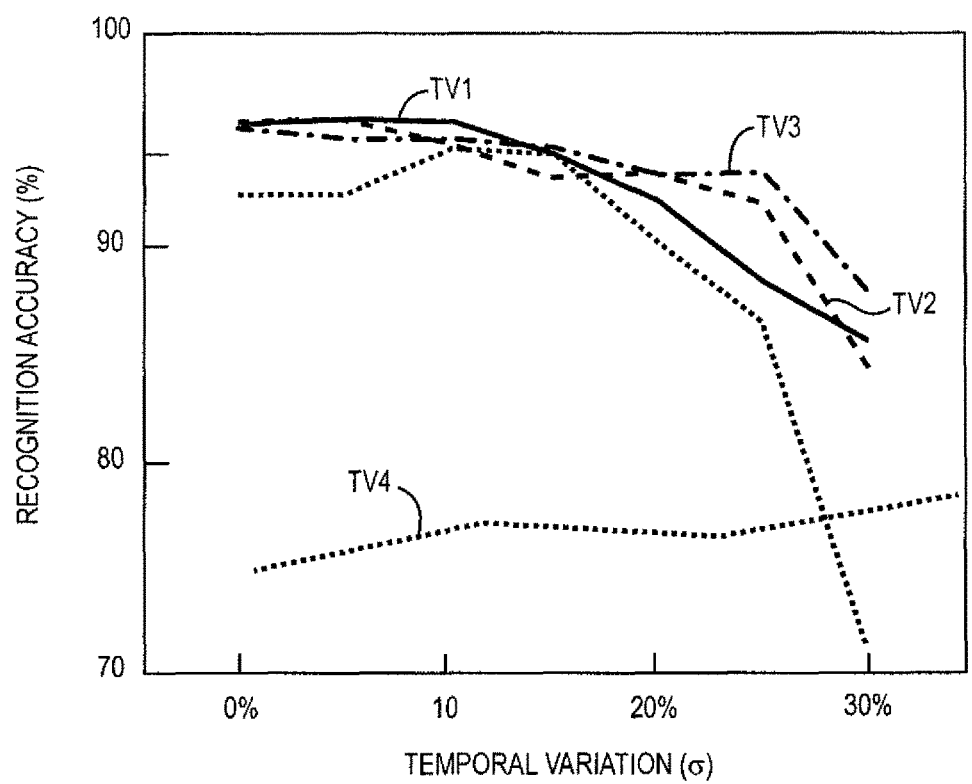

FIG. 7B illustrates the effects of temporal variation of the variable conductance of one of the variable resistive elements shown in FIG. 1 during variable conductance updates.

Figure 8A:
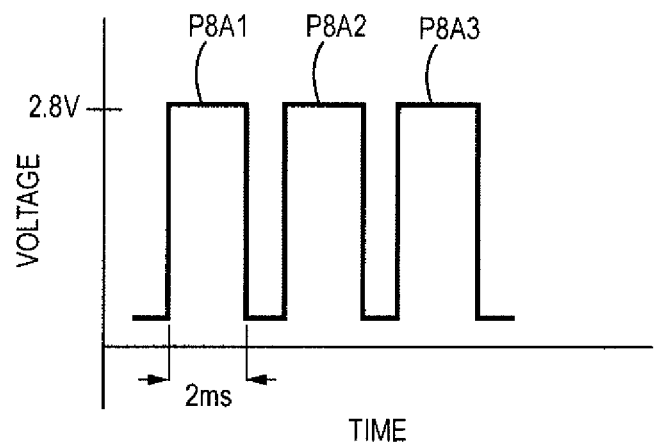
Figure 8B:
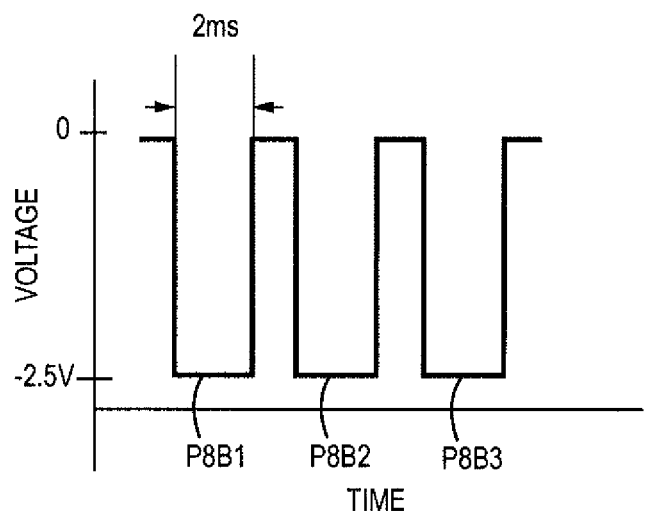

FIG. 8A and FIG. 8B illustrate a technique where a pulse train of voltage pulses are utilized to change the variable conductance of one of the variable resistive elements shown in FIG. 1 where the voltage pulses each have the same temporal duration.

Figure 9A:
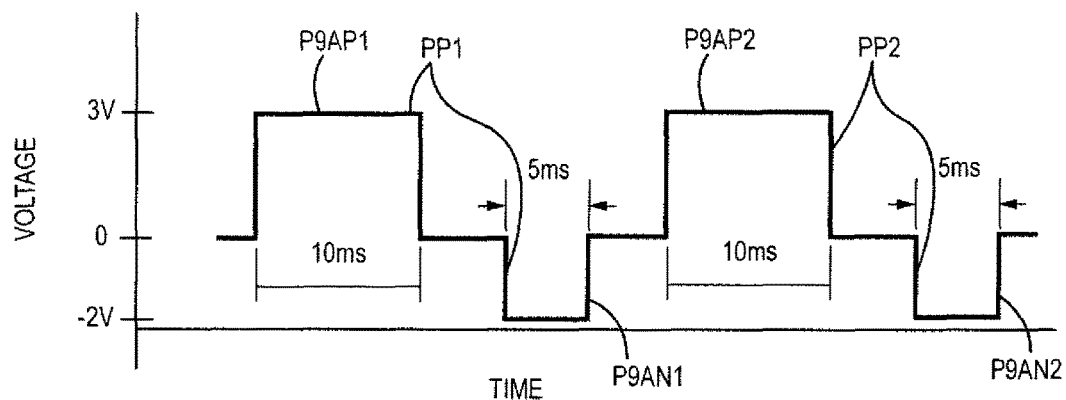
Figure 9B:
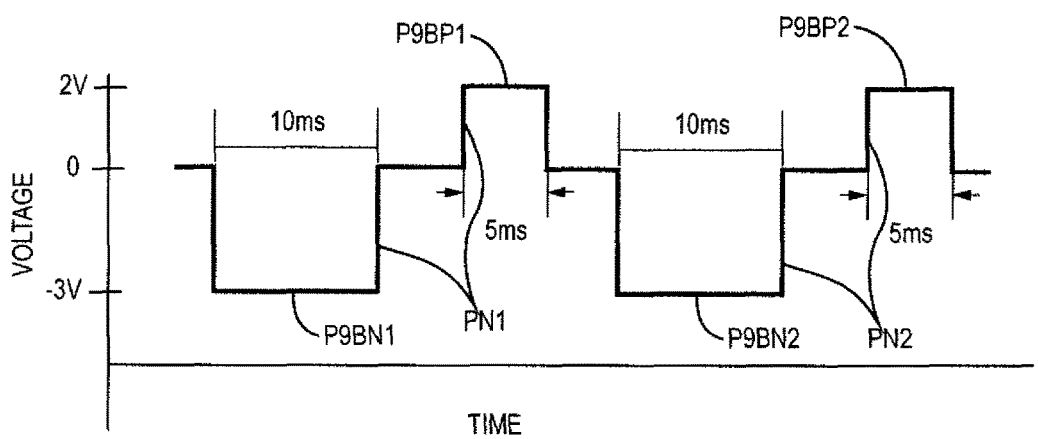

FIG. 9A and FIG. 9B illustrate a technique where a pulse train of positive and negative voltage pulse pairs are utilized to change the variable conductance of one of the variable resistive elements shown in FIG. 1.

Figure 10A:
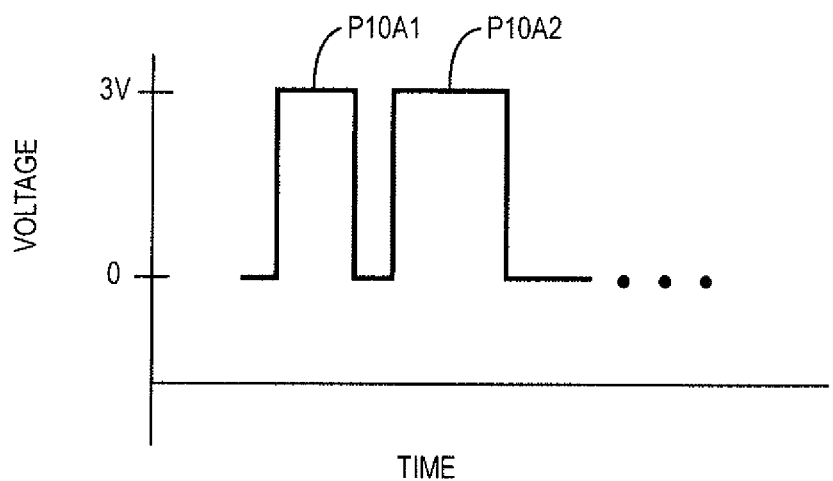
Figure 10B:
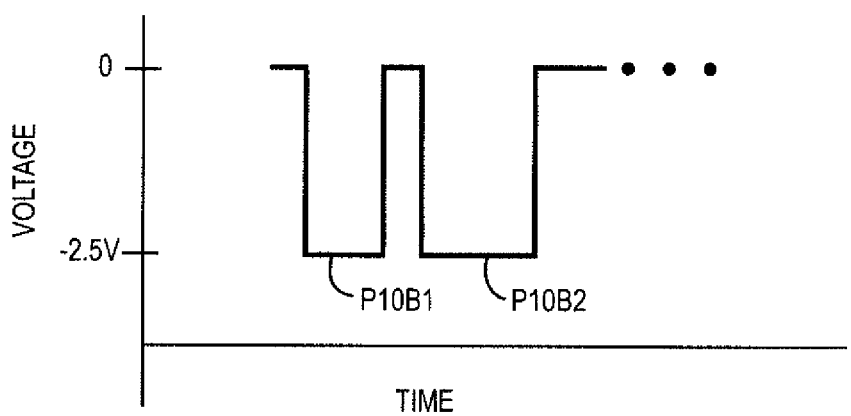

FIG. 10A and FIG. 10B illustrate a technique where a pulse train of voltage pulses are utilized to change the variable conductance of one of the variable resistive elements shown in FIG. 1 where a pulse duration of each of the voltage pulses is determined in accordance to Equation (6) shown in FIG. 4.

Figure 11:
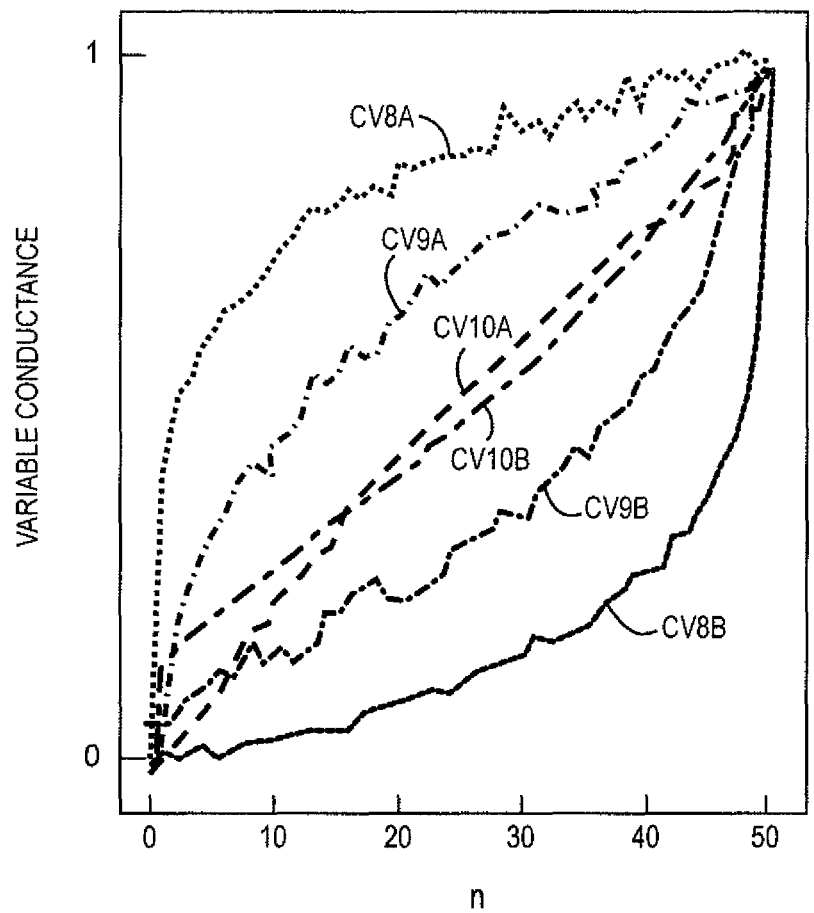

FIG. 11 illustrates exemplary curves that graph a normalized variable conductance of one of the variable resistive elements shown in FIG. 1 based on the techniques shown in FIG. 8A, FIG. 8B, FIG. 9A, FIG. 9B, FIG. 10A, and FIG. 10B.

Figure 12:
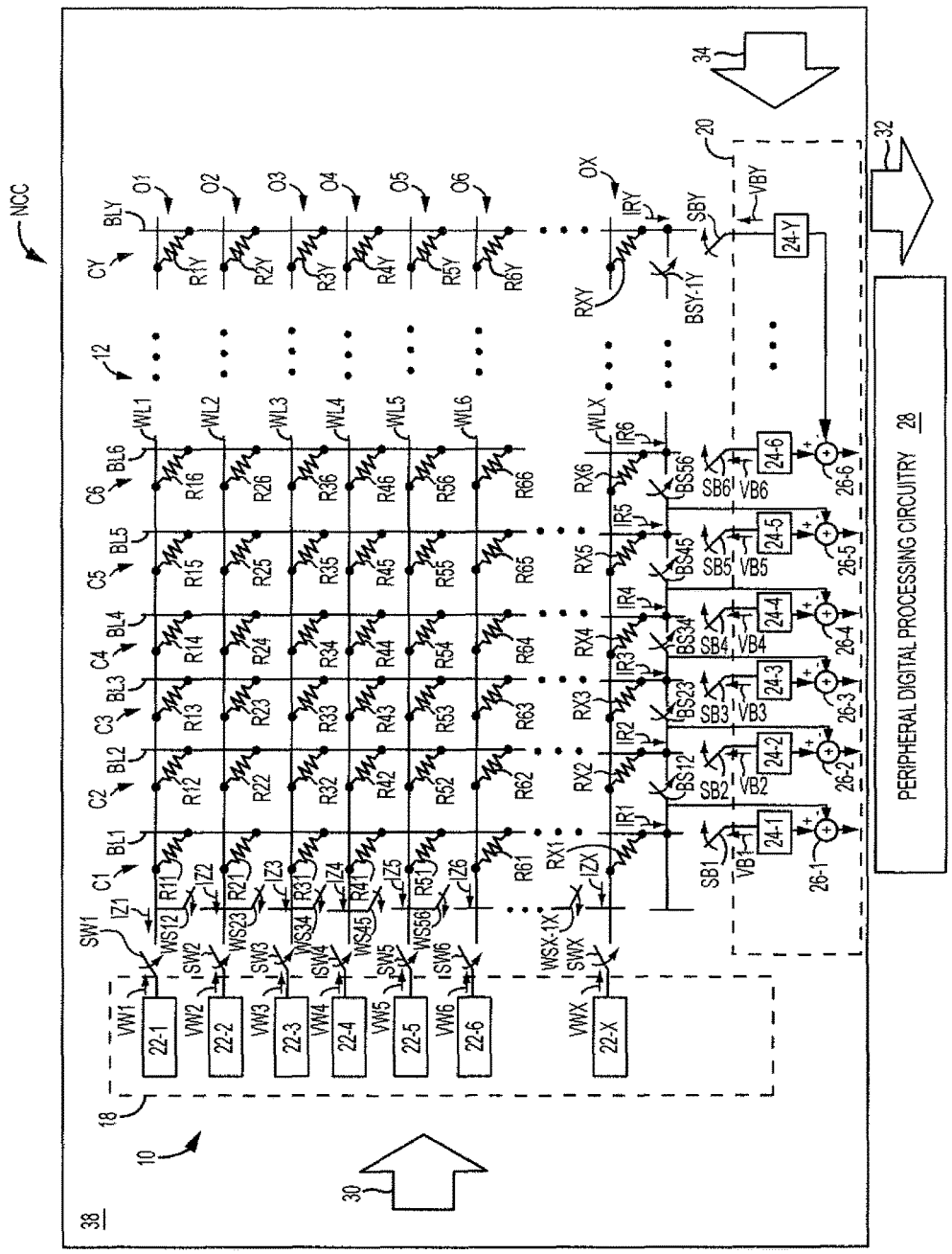

FIG. 12 illustrates another exemplary embodiment of neuromorphic computational circuitry having a cross point resistive network that is reconfigurable so that the variable resistive units can be provided as different combinations of one or more of the variable resistive elements in the cross point resistive network.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates to neuromorphic computational circuitry that includes a resistive memory system with a cross point resistive network used to represent the matrix values of a matrix. More specifically, the cross point resistive network is a network of variable resistive elements where variable resistive units of one or more of the variable resistive elements each provide a variable conductance that represents a corresponding matrix value of the matrix. For instance, in some implementations, the variable resistive units are each provided by an individual variable resistive element and thus a variable conductance of each of the variable resistive elements in the cross point resistive network represents a matrix value of the matrix. On the other hand, variable resistive units may each be provided by a group of the variable resistive elements (such as for example a subarray of the variable resistive elements) in the cross point resistive network. In this case, the combined variable conductance of each group (e.g., subarray) of the variable resistive elements represents a corresponding matrix value of the matrix.

The resistive memory systems of the neuromorphic computational circuitry can be utilized to implement neuromorphic algorithms that mimic biological neural networks. Stochastic Gradient Descent (SGD) is one of the most efficient algorithms that aims to minimize the reconstruction error $\Sigma_i \|D \cdot Z - x\|^2$, where x is an input vector, D is a matrix called a dictionary, and Z is a coefficient vector, which is usually assumed to be sparse in many problems. To implement the neuromorphic algorithms, the matrix values of the matrix D are mapped to the variable conductances of variable resistive units. Learning takes place by updating the matrix values of the matrix D and thus by adjusting the variable conductances of the variable resistive units. Matrix operations, including updating the matrix values, can take place entirely in parallel as described in further detail below. The matrix D may be considered to be an (m×p) matrix of matrix values, where m and p are both integer numbers.

Systems, methods and techniques are disclosed that improve the learning accuracy and computational accuracy of the neuromorphic computational circuitry by reducing the effects of different types of variations between the variable resistive elements in the cross-point resistive network. As such, the neuromorphic computational circuitry can be integrated more reliably to resolve problems such as image recognition with increased speed.

FIG. 1 illustrates an exemplary embodiment of a neuromorphic computational circuitry NCC, which includes an exemplary embodiment of a resistive memory system 10 that is configured to implement matrix vector product operations and conductance update operations in parallel. The resistive memory system 10 may be configured to perform an artificial intelligence algorithm, such as neuro-inspired machine learning algorithms. The resistive memory system 10 includes a cross point resistive network 12. The cross point resistive network 12 includes variable resistive elements R11, R12, R13, R14, R15, R16, R1Y, R21, R22, R23, R24, R25, R26, R2Y, R31, R32, R33, R34, R35, R36, R3Y, R41, R42, R43, R44, R45, R46, R4Y, R51, R52, R53, R54, R55, R56, R5Y, R61, R62, R63, R64, R65, R66, R6Y, RX1, RX2, RX3, RX4, RX5, RX6, RXY (referred to generically as variable resistive elements R) and conductive lines WL1, WL2, WL3, WL4, WL5, WL6, WLX, BL1, BL2, BL3, BL4, BL5, BL6, BLY (referred to generically as conductive lines W/BL). Each of the variable resistive elements R may be any type of electronic element with a variable resistance that varies between different resistive states. Thus, each of the variable resistive elements R has a variable conductance that varies between different conductance states. The variable resistive elements may be or may include resistive random access memory (RRAM) elements, conductive bridge random access memory (CBRAM) elements, phase change memory (PCM) elements, spin transfer torque magnetic random access memory (STTMRAM) resistive elements, and/or the like.

The conductive lines W/BL are coupled to the variable resistive elements R such that the conductive lines W/BL and the variable resistive elements R form the cross point resistive network 12. Thus, each of the variable resistive elements R is connected between a corresponding pair of the conductive lines W/BL.

In this embodiment, the conductive lines W/BL are arranged to include word lines WL1, WL2, WL3, WL4, WL5, WL6, WLX (referred to generically as word lines WL) and bit lines BL1, BL2, BL3, BL4, BL5, BL6, BLY (referred to generically as bit lines BL). The word lines WL and the bit lines BL extend in substantially orthogonal directions but, in this embodiment, are not directly connected to one another. Instead, each of the variable resistive elements R is connected between a corresponding one of the word lines WL and a corresponding one of the bit lines BL such that the cross point resistive network 12 is a cross point resistive array. Different sets of the variable resistive elements R can be identified based on the word line WL and bit line BL coupled to the particular set of the variable resistive elements. For example, the variable resistive elements R in the cross point resistive network 12 shown in FIG. 1 are arranged in rows of the variable resistive elements R and columns of the variable resistive elements R. Each of the variable resistive elements R in a row is connected to the same word line WL, and each of the variable resistive elements R in a column is connected to the same bit line BL. There is an integer number Y of variable resistive elements R in each row. There is also an integer number X of the variable resistive elements R in each column.

More specifically, in the embodiment shown in FIG. 1, a set of the variable resistive elements R11, R12, R13, R14, R15, R16, R1Y are in a row O1 and are each connected to the word line WL1. A set of the variable resistive elements R21, R22, R23, R24, R25, R26, R2Y are in a row O2 and are each connected to the word line WL2. A set of the variable resistive elements R31, R32, R33, R34, R35, R36, R3Y are in a row O3 and are each connected to the word line WL3. A set of the variable resistive elements R41, R42, R43, R44, R45, R46, R4Y are in a row O4 and are each connected to the word line WL4. A set of the variable resistive elements R51, R52, R53, R54, R55, R56, R5Y are in a row O5 and are each connected to the word line WL5. A set of the variable resistive elements R61, R62, R63, R64, R65, R66, R6Y are in a row O6 and are each connected to the word line WL6. A set of the variable resistive elements RX1, RX2, RX3, RX4, RX5, RX6, RXY are in a row OX and are each connected to the word line WLX.

Furthermore, in the embodiment shown in FIG. 1, a set of the variable resistive elements R11, R21, R31, R41, R51, R61, RX1 are in a column C1 and are each connected to the bit line BL1. A set of the variable resistive elements R12, R22, R32, R42, R52, R62, RX2 are in a column C2 and are each connected to the bit line BL2. A set of the variable resistive elements R13, R23, R33, R43, R53, R63, RX3 are in a column C3 and are each connected to the bit line BL3. A set of the variable resistive elements R70, R24, R34, R44, R54, R64, RX4 are in a column C4 and are each connected to the bit line BL4. A set of the variable resistive elements R15, R25, R35, R45, R55, R65, RX5 are in a column C5 and are each connected to the bit line BL5. A set of the variable resistive elements R16, R26, R36, R46, R56, R66, RX6 are in a column C6 and are each connected to the bit line BL6. A set of the variable resistive elements R1Y, R2Y, R3Y, R4Y, R5Y, R6Y, RXY are in a column CY and are each connected to the bit line BLY.

It should be noted that the cross point resistive network 12 shown in FIG. 1 is simply exemplary. For example, the cross point resistive network 12 may not be provided as a cross point resistive array but instead in some other suitable alternative physical arrangement. Furthermore, the integer number of the variable resistive elements R in each row is X, and the integer number of the variable resistive elements R in each column is Y, where the integer number X and the integer number Y may be any integer number greater than one. However, asymmetric or partially asymmetric alternative arrangements may also be provided where a different integer number of the variable resistive elements R are provided within a proper subset of the rows and/or a different integer number of the variable resistive elements R are provided within a proper subset of the columns.

Throughout this disclosure the term "variable resistive unit" refers to a subset of one or more of the variable resistive elements R used to represent a value. For example, when the cross point resistive network 12 is being used to represent a matrix of matrix values, a variable resistive unit refers to an a subset of one or more of the variable resistive elements R used to represent a corresponding one of the matrix values in the matrix. Thus, each of the matrix values of the matrix may be mapped to a corresponding variable resistive unit provided by the cross point resistive network 12.

In the embodiment shown in FIG. 1, the variable resistive units are fixed and in particular each variable resistive unit is provided by a different individual one of the variable resistive elements R. Thus, each of the matrix values of the matrix is represented by a variable conductance of a corresponding one of the variable resistive elements R. However, in alternative embodiments, each of the matrix values of the matrix may be represented using a group of the resistance elements R, such as a subarray of the variable resistive elements R. Accordingly, in these alternative embodiments, the variable resistive units would be groups of the variable resistive elements, such as subarrays of the variable resistive elements R, as explained in further detail below (See FIG. 12). Furthermore, alternative embodiments of the cross point resistive network 12 are configured so that the variable resistive units are reconfigurable (i.e., not fixed) so that different arrangements of one or more of the variable resistive elements R are selectable (See FIG. 12).

Referring again to FIG. 1, each of the variable resistive elements R has a variable resistance and thus also a variable conductance. In this embodiment, the variable conductance of each of the variable resistive elements R is configured to be provided in any one of a set of conductance states. The set of conductance states ideally is the same for each of the variable resistive elements R since each of the variable resistive elements R ideally is identical. However, this may not be the case as a result of different types of variations between the variable resistive elements R. The techniques described in this disclosure help reduce the effects of these variations so that the variable resistive elements R are more reliable thereby increasing the performance of the neuromorphic computational circuitry NCC.

Each of the conductance states in the set of the conductance states may be defined by a particular conductance magnitude or a particular range of conductance magnitudes. Thus, for each of the variable resistive elements R, the set of conductance states can be ordered. For example, the set of conductance states may include a minimum conductance state one or more intermediary conductance states, and a maximum conductance state where an order of the conductive states can be from highest to lowest or from lowest to highest. In this manner, each conductance state of the set of conductance states can represent a discrete value in a set of the discrete values. The set of the discrete values are the set of possible values that each matrix value can have in the matrix D. Accordingly, the set of conductance states bijectively correspond to the set of the discrete values. Furthermore, the set of conductance states correspond to the set of the discrete values in a same order of relative degree. Accordingly, the minimum discrete value in the set of the discrete values corresponds to the minimum conductance state, the lowest intermediary discrete value greater than the minimum discrete corresponds to the lowest intermediary conductance state greater than the minimum conductance state, etc. The pattern continues so that the greatest discrete value corresponds with the maximum conductance state.

For example, in one embodiment, each of the variable resistive elements R is configured to vary the variable conductance between any one of a set of sixty-four (64) conductance states. As such, each conductance state in the set of conductance states represents one of a set of sixty-four (64) discrete values. The low discrete value (e.g., 0) is represented by the minimum conductance state. The sixty-two (62) intermediary conductance states correspond in ascending order to the sixty-two (62) intermediary discrete values. Finally, the maximum conductance state corresponds with the greatest discrete value. Ideally, a conductance difference between a conductance state and the next highest and/or the next lowest conductance state is the same for every conductance state. However, variations can result in non-linearity between the conductance states as explained in further detail below.

In one implementation of the neuromorphic computational circuitry NCC shown in FIG. 1, the variable resistive elements R that are not in the column CY are used to represent the matrix values of the matrix D. Accordingly, the variable conductance of each of the variable resistive elements R11, R21, R31, R41, R51, R61, RX1 in the column C1 represents a corresponding one of the matrix values of the matrix D. The variable conductance of each of the variable resistive elements R12, R22, R32, R42, R52, R62, RX2 in the column C2 represents a corresponding one of the matrix values of the matrix D. The variable conductance of each of the variable resistive elements R13, R23, R33, R43, R53, R63, RX3 in the column C3 represents a corresponding one of the matrix values of the matrix D. The variable conductance of each of the variable resistive elements R70, R24, R34, R44, R54, R64, RX4 in the column C4 represents a corresponding one of the matrix values of the matrix D. The variable conductance of each of the variable resistive elements R15, R25, R35, R45, R55, R65, RX5 in the column C5 represents a corresponding one of the matrix values of the matrix D. The variable conductance of each of the variable resistive elements R16, R26, R36, R46, R56, R66, RX6 in the column C6 represents a corresponding one of the matrix values of the matrix D.

The variable resistive elements R that are not in the column CY are referred to generically or collectively as variable resistive elements RD. Thus, each of the variable resistive elements R11, R21, R31, R41, R51, R61, RX1, R12, R22, R32, R42, R52, R62, RX2, R13, R23, R33, R43, R53, R63, RX3, R18, R24, R34, R44, R54, R64, RX4, R15, R25, R35, R45, R55, R65, RX5, R72, R26, R36, R46, R56, R66, RX6 is one of the variable resistive elements RD (note that each of these variable resistive elements R are not labeled with RD in FIG. 1 but are referred to as RD for the sake of clarity and brevity). To do this, for each variable resistive elements RD in the cross point resistive network 12, the row and column position of the variable resistive element RD corresponds directly with a row and column position of the corresponding matrix value being represented by the variable resistive element RD. Furthermore, the variable conductance of each of the matrix variable resistive elements RD is provided in the conductance state of the set of conductance states that corresponds with the discrete value in the set of the discrete values that corresponds to the matrix value.

When the neuromorphic computational circuitry NCC is implementing neuromorphic algorithms to provide machine learning, the matrix values of the matrix D are normalized synapse weights. Thus, each of the matrix values can vary between a set of the discrete values from "0" to "1." For example, the minimum discrete value of each of the matrix values is "0" while the maximum discrete value of each of the matrix value is "1." Intermediary discreet values in the set of the discrete values will be greater than "0" but less than "1." Accordingly, the minimum conductance state of the set of conductance states represents the discreet value of "0," intermediary conductance states represent discreet values that are greater than "0" but less than "1," and the maximum conductance state represents the discreet value of "1."

The minimum conductance state may thus be the off conductance state of the variable resistive elements R while the maximum conductance state of the variable resistive elements R would be the on conductance state of the variable resistive elements R. Ideally then, the off conductance (and thus the minimum conductance state) would be zero conductance while the maximum conductance state would be infinite conductance. Accordingly, the off conductance state (and thus the minimum conductance state) can represent the discrete value of "0 ideally only when a ratio between the on conductance (and thus the maximum conductance state) and the off conductance (and thus the minimum conductance state) is infinity. This however is not practically feasible. Furthermore simulations have shown that the learning accuracy of the computational circuitry implementing neuromorphic algorithms dramatically decreases when the ratio between the on conductance state (and thus the maximum conductance state) and the off conductance state (and thus the minimum conductance state) shrinks below 25. This is because calculations involving small matrix values can be significantly distorted by current resulting from the off conductance.

To remedy this and reduce or even eliminate the effect of the off conductance state, the set of the variable resistive elements in the column CY are each provided in the minimum conductance state. Accordingly, the variable conductance of each of the variable resistive elements R1Y, R2Y, R3Y, R4Y, R5Y, R6Y, RXY are each provided in the minimum conductance state. Therefore, the variable resistive elements R in the column CY are configured to generate a correction line current IRY on the conductive line BLY. As explained in further detail below, the correction line current IRY is used to correct the effects of the non-zero minimum conductance state in each of the columns C1, C2, C3, C4, C5, and C6. Except for spatial variation between the synaptic devices in the same row O1-O6, this virtually eliminates the effect of off conductance state during the read operation and therefore results in greater computation accuracy.

To read, write, and update the cross point resistive network 12, the resistive memory system 10 also includes word fine control circuitry 18 and bit line control circuitry 20. The word line control circuitry 18 is configured to generate a word line output, which in this embodiment may be provided as different combinations of word line voltages VW1, VW2, VW3, VW4, VW5, VW6, VWX (referred to generically as word line voltages VW), as explained in further detail below. The bit line control circuitry 20 is configured to generate a bit line output, which in this embodiment may be provided as different combinations of bit line voltages VB1, VB2, VB3, VB4, VB5, VB6, VWY (referred to generically as bit line voltages VB). The word line control circuitry 18 is configured to generate the word line output onto the word lines WL, and the bit line control circuitry 20 is configured to generate the bit line output onto the bit lines BL such that different types of matrix operations can be performed in parallel. For example, the word line output can be generated to represent a vector to perform matrix multiplication in parallel. Similarly, the bit line output can be generated to represent a vector to perform matrix multiplication in parallel. Furthermore, the word line control circuitry 18 is configured to generate the word line output onto the word lines WL, and the bit line control circuitry 20 is configured to generate a bit line output onto the bit lines BL.

The word line control circuitry 18 includes an integer number X of word line controllers (referred to generically as word line controllers 22 and specifically as word line controllers 22-1 through 22-X). Each of the word line controllers 22 is configured to generate a corresponding one of the word line voltages VW onto a corresponding one of the word lines WL, as shown in FIG. 1. With respect to the bit line control circuitry 20, the bit line control circuitry 20 includes an integer number Y of bit line controllers (referred to generically as bit line controllers 24 and specifically as bit line controllers 24-1 through 24-Y). Each of the bit line controllers 24 is configured to generate a corresponding one of the bit line voltages VB onto a corresponding one of the bit lines BL, as shown in FIG. 1.

Different types of matrix operations that may be performed with the resistive memory system 10 using the word line control circuitry 18 and the bit line control circuitry 20. More specifically, the peripheral digital computational circuitry 28 is configured to control the resistive memory system 10 so that the matrix operations and neuromorphic algorithms described in this disclosure are implemented with the resistive memory system 10. For example, the peripheral digital computational circuitry 28 may generate control outputs to the word line control circuitry 18 and the bit line control circuitry 20 so that the procedures for the operations described herein are performed as described in this disclosure.

As mentioned above, the matrix values of the matrix D are mapped onto the variable resistive units and the variable resistive units in FIG. 1 are individual variable resistive elements R. Accordingly, the matrix values of the matrix D are mapped to the variable conductances of the variable resistive elements RD in all of the columns except for the column CY. Each of the word line controllers 22 and each of the bit line controllers 24 have write circuitry and read circuitry in order to perform matrix operations, as described herein. The matrix values of the matrix D are represented by G, which are the variable conductances of the variable resistive elements RD. $G_{ij}$ is a particular variable conductance corresponding to the variable resistive unit at a row position i and a column position j.

Learning takes place through a D update operation. Since the matrix values of the matrix D are represented by the variable conductance of a corresponding one of the variable conductance elements RD, the variable conductances of the variable resistive elements RD need to be set to the conductance state in the set of conductance states that corresponds to the corresponding matrix value of the matrix whenever the matrix D is updated. The D update operation is performed by setting the variable conductance of each of the variable conductance elements RD to the conductance state that corresponds to an updated discrete value for the corresponding matrix value represented by the variable conductance. The D update operation is a write type operation that is performed by generating the word line output and the bit line output as large appropriately timed voltage pulses, as explained in further detail below. In this manner, the combined variable conductances of all the variable resistive units (which in FIG. 1 are the variable resistive elements RD) in the entire cross point resistive network 12 are updated in parallel. During the D update operation, the word line output and the bit line output are generated so that the variable conductance of each of the variable resistive elements R1Y, R2Y, R3Y, R4Y, R5Y, R6Y, RXY in the column CY are provided in the minimum conductance state.

The update D operation is performed utilizing write circuits in the word line controllers 22 of the word line control circuitry 18 and write circuits in the bit line controllers 24 of the bit line control circuitry 20. Each of the matrix values of the matrix D may have a value range of the discrete values. For example, in one embodiment, each of the matrix values of the matrix D may be provided as any one of sixty four different values. The change in the matrix D is equal to $\Delta D = \eta \cdot r \cdot Z$. The value $\eta$ is the learning rate. The change in the matrix D is thus proportional to the matrix multiplication of the resultant vector $r \cdot Z$. $\Delta D = \eta \cdot r \cdot Z$ thus indicates differences between the discrete value each of the matrix values is currently assigned to prior to the update operation and the discrete value that each of the matrix values is to be updated to as a result of the update operation. The discrete value that each of the matrix values is to be updated to corresponds to a target conductance state in the set of conductance states.

Accordingly, the peripheral digital computational circuitry 28 is configured to operate the resistive memory system 10 during the D update operation so that each of the variable resistive units (which in FIG. 1 are individual variable resistive elements R) change their variable conductance from a current conductive state prior to the D update operation to the target conductance state that corresponds to the discrete value that each of the matrix values is to be updated to as a result of the update operation. In this manner, the variable conductances of the variable resistive units (which in FIG. 1 are individual variable resistive elements R) can represent the matrix values of the D matrix. The change for each variable conductance can thus be represented by changing each of the variable conductances by approximately:

$$\Delta G_{ij} = \eta \cdot r_i \cdot Z_j$$

$G_{ij}$ represents the variable conductance of the variable resistive unit (which in this example is one of the individual variable resistive elements RD) and thus the above equation provides the required change in the variable conductance. In this embodiment, the peripheral digital computational circuitry 28 does not calculate $Z \cdot r$ before programming. Instead, the word line control circuitry 18 is configured to generate the word line output onto the word lines WL and the bit line control circuitry 20 is configured to generate the bit line output onto the bit lines BL such that each of the plurality of variable conductances provided by the variable resistive units (which in FIG. 1 are individual variable resistive elements R) is adjustable in parallel. To do this, the peripheral digital computational circuitry 28 is configured to generate a digital vector output 30 of the digital vector values of the vector r and receive a resultant digital vector output 32 that represents the vector Z from the bit line control circuitry 20. The word line control circuitry 18 is configured to receive the digital vector output 30, and the bit line control circuitry 20 is configured to generate the resultant digital vector output 32, as explained in further detail below. A combination of the word line controllers 22 generates a combination of the word line voltage VW, and a combination of the bit line controllers 24 will generate the bit line voltages VB. The combination of the word line controllers 22, the word line voltage VW, the bit line controllers 24, and bit line voltages will depend on the size of the of the variable resistive units (which in FIG. 1 are individual variable resistive elements R) selected to provide variable conductances, as explained below with regard to the D·Z operation and the $D^T \cdot r$ operation.

However, during the update D operation, the word line voltages VW and the bit line voltages VB are generated at the same time. The matrix values of the vector $Z_j$ are always positive numbers, while the vector values $r_i$ of the vector r can be positive or negative, depending on the residual error. Therefore whether the matrix value of the matrix D and the corresponding variable conductance $G_{ij}$ that represents the matrix value will increase or decrease depending on the sign of the corresponding the vector value $r_i$, but not the vector value $Z_j$. When vector value $r_i$ is positive, the matrix value and thus the variable conductance $G_{ij}$ decreases (also referred to as depression), but when the vector value $r_i$ is positive, the matrix value and thus the variable conductance $G_{ij}$ increases (also referred to as potentiation).

Next, write circuits in the word line controllers 22 of the word line control circuitry 18 and read circuits in the bit line controllers 24 of the bit line control circuitry 20 are used by the peripheral digital computational circuitry 28 so that the resistive memory system 10 performs the D·Z operation. As explained in further detail below, this operation is a matrix multiplication operation performed by applying the world line voltages VW representing the vector Z on the word lines WL, and obtaining resultant bit line currents (referred to generically as IR and specifically as IR1-IR6) representing resultant vector from the bit lines BL1-BL6.

The combination of resultant bit line currents IR1-IR6 represents the resultant vector of resulting from the D·Z operation. Matrix multiplication is thus achieved in parallel since each of the bit line currents IR1-IR6 represents a different vector value of the resultant vector.

The sets of the variable resistive elements RD in each of the columns C1-C6 are configured to generate resultant line currents BY1-BY6 such that each of the columns C1-C6 of the variable resistive elements RD generates a different one of the resultant line currents BY1-BY6 on the corresponding conductive line. Accordingly, the word line controllers 22 will each generate a corresponding word line voltage VW so that all of the word line voltages VW1-VWX are applied to the word lines WL1-WLX. Each of the write circuits in each of the word line controllers 22 is configured to convert a corresponding one of the digital vector values into its corresponding word line voltage VW such that the word line voltage VW represents the corresponding one of the digital vector values. In this case, the word line controllers 22 set the word line voltages VW to a voltage magnitude that is proportional to the corresponding digital vector value of the vector Z. For each of the word line voltages VW, the word line voltage VW multiplied by the combined variable conductance $G_{ij}$ represents weight times vector value multiplication. Summation takes place since the resultant vector value for a column of variable resistive units (which in FIG. 1 are individual variable resistive elements R) is the result of all of the variable conductances of the corresponding column of variable resistive units (which in FIG. 1 are individual variable resistive elements R).

With regards to the embodiment shown in FIG. 1, the resultant bit line currents IR1-IR6 will be provided in response to the word line voltages VW1-VWX. Each of the resultant bit line currents IR1-IR6 is approximately equal to the weighted sum of each word line voltage VW multiplied by the variable conductance of each of the variable resistive elements RD in different corresponding column C1-C6 of the variable resistive elements RD. Thus, the current level of each of the resultant bit line currents IR1-IR6 represents the resultant vector resulting from the D·Z operation. However, the resultant bit line currents IR1-IR6 have current levels that are in error due to the minimum off state conductance. This is corrected by the bit line control circuitry 20 using the correction bit line current IRY on the bit line BLY, as explained in further detail below.

The bit line control circuitry 20 is coupled to receive the correction line current IRY and the resultant line currents IR1-IR6 from the bit lines BL. Each of the bit line controllers 24 includes a read circuit. In this case, each of the bit line controllers 24 of the bit line control circuitry 20 is configured to receive a corresponding one of the bit line currents IR1-IRY from its corresponding bit line BL. The read circuit in each of the bit line controllers 24 is configured to convert its corresponding bit line current IR to a digital value representing the current level of the corresponding bit line BL. Thus, the bit line controller 24-1 is configured to receive the resultant bit line current IR1 on the bit line BL1. The resultant bit line controller 24-1 is configured to generate a digital vector value that indicates a current level of the resultant bit line current IR1. The bit line controller 24-2 is configured to receive the resultant bit line current IR2 on the bit line BL2. The resultant bit line controller 24-2 is configured to generate a digital vector value that indicates a current level of the resultant bit line current IR2. The bit line controller 24-3 is configured to receive the resultant bit line current IR3 on the bit line BL3. The resultant bit line controller 24-3 is configured to generate a digital vector value that indicates a current level of the resultant bit line current IR3. The bit line controller 24-4 is configured to receive the resultant bit line current IR4 on the bit line BL4. The resultant bit line controller 24-4 is configured to generate a digital vector value that indicates a current level of the resultant bit line current IR4. The bit line controller 24-5 is configured to receive the resultant bit line current IR5 on the bit line BL5. The resultant bit line controller 24-5 is configured to generate a digital vector value that indicates a current level of the resultant bit line current IR5. The bit line controller 24-6 is configured to receive the resultant bit line current IR6 on the bit line BL6. The resultant bit line controller 24-6 is configured to generate a digital vector value that indicates a current level of the resultant bit line current IR6. Finally, the bit line controller 24-Y is configured to receive the correction bit line current IRY on the bit line BLY. The resultant bit line controller 24-Y is configured to generate a digital correction value that indicates a current level of the correction bit line current IRY. Note that the digital vector values generated as a result of the resultant bit line current IR6 are off due to the off state conductance.

Accordingly, the bit line control circuitry 20 further includes subtractors (referred to specifically as substrators 26-1 to 26-6 and generically as substractors 26). The substractors 26 are configured to generate digital vector values such that each of the digital vector values is set in accordance with a difference between a current level of a corresponding resultant line current IR1-IR6 of the resultant current levels and a current level of the correction line current IRY. In this manner, each of the digital vector values output from the substrators 26 is corrected by the digital correction value and thus for the off state conductance error. More specifically, the subtractor 26-1 is configured to receive the digital vector value generated by the read circuit of the bit line controller 24-1 and the digital correction value from the read circuit of the bit line controller 24-Y. The subtractor 26-1 is configured to subtract the digital correction value from the digital vector value 52-1 and generate a digital vector value equal to difference between the digital vector value from the read circuit of the bit line controller 24-Y and the digital correction value. The subtractor 26-2 is configured to subtract the digital correction value from the digital vector value 52-2 and generate a digital vector value equal to difference between the digital vector value from the read circuit of the bit line controller 24-Y and the digital correction value. The subtractor 26-3 is configured to subtract the digital correction value from the digital vector value 52-3 and generate a digital vector value equal to difference between the digital vector value from the read circuit of the bit line controller 24-Y and the digital correction value. The subtractor 26-4 is configured to subtract the digital correction value from the digital vector value 52-4 and generate a digital vector value equal to difference between the digital vector value from the read circuit of the bit line controller 24-Y and the digital correction value. The subtractor 26-5 is configured to subtract the digital correction value from the digital vector value 52-5 and generate a digital vector value equal to difference between the digital vector value from the read circuit of the bit line controller 24-Y and the digital correction value. The subtractor 26-6 is configured to subtract the digital correction value from the digital vector value 52-6 and generate a digital vector value equal to difference between the digital vector value from the read circuit of the bit line controller 24-Y and the digital correction value. The resultant digital vector values from the bit line controllers 24 are combined so that the bit line control circuitry 20 generates a resultant digital vector output 32. The resultant digital vector output 32 is received by the peripheral digital computational circuitry 28 to continue implementing the learning algorithm.

The $D^T \cdot r$ operation is performed utilizing write circuits in the bit line controllers 24 of the bit line control circuitry 20 and read circuits in the word line controllers 22 of the word line control circuitry 18. The $D^T \cdot r$ operation is a matrix multiplication operation performed by applying the bit line voltages VB representing the vector r on the bit lines BL and obtaining word line currents (referred to generically as IZ and specifically as IZ1-IZX) representing resultant vector $D^T \cdot r$ from the word lines WL. The peripheral digital computational circuitry 28 is configured to generate the digital vector output 30 that includes digital vector values of the vector r. Each of the write circuits in each of the bit line controllers 24 is configured to convert a corresponding one of the digital vector values into its corresponding bit line voltage VB such that the bit line voltage VB represents the corresponding one of the digital vector values. In this case, the bit line controllers 24 are configured to set each of the voltage magnitudes of each of the bit line voltages VB in accordance with its corresponding digital vector value.

Each of the word line controllers 26 has a read circuit configured to receive a corresponding one of word line currents IZ from a corresponding one of the word lines WL. The read circuits in the word line controllers 26 are configured to generate the digital vector output 36 from the word line currents IZ. More specifically, the read circuit in each of the word line controllers 26 is configured to generate a corresponding one of the digital vector values such that the corresponding digital vector value is set in accordance with a current level of corresponding word line current IZ received from the corresponding word line WL. The digital vector output 36 includes each of the digital vector values of the resultant vector Z. The peripheral digital computational circuitry 28 is configured to receive the digital vector output 36 in order to perform neuromorphic algorithms, as described in further detail below.

In one exemplary embodiment of the resistive memory system 10, all of the variable resistive elements R are each provided as an RRAM element. The cross point resistive network 12, the word lines WL, the bit lines BL, the switchable paths W/BS, the switch control circuitry 14, the word line control circuitry 18, and the bit line control circuitry 20 are all formed on a semiconductor die 38. In one embodiment, the switchable paths W/BS, the word line control circuitry 18, and the bit line control circuitry 20 are formed in a semiconductor substrate of the semiconductor die 38. The variable resistive elements R, the word lines WL, and the bit lines BL may be formed within the BEOL of the semiconductor die 38. Also, in one exemplary embodiment, the peripheral digital computational circuitry 28 is provided as an Intel i7 8-core processor, memory, and a digital interface. The memory stores software run by the Intel i7 8-core processor to coordinate the implementation of the learning algorithm along with digital representations of the Z vector, r vector, and x vector. The digital interface operably associates the peripheral digital computational circuitry 28 with the word line control circuitry 18, and the bit line control circuitry 20, so that the digital vector output 30, the resultant digital vector output 32, the digital vector output 34 and the resultant digital vector output 36 can be transmitted to and/or from the peripheral digital computational circuitry 28.

Figure 2:
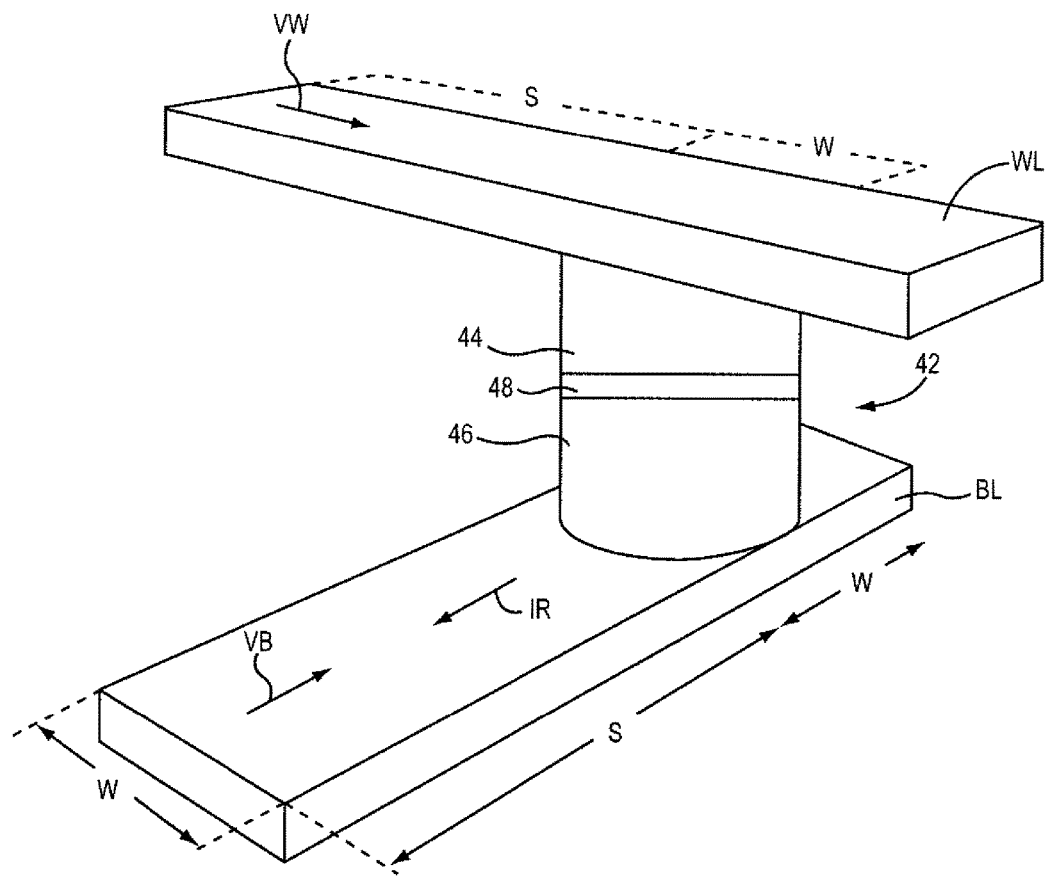
FIG. 2 illustrates an exemplary embodiment of resistive random access memory (RRAM) element, which may be utilized in the cross point resistive network shown in FIG. 1.

FIG. 2 illustrates an exemplary embodiment of an RRAM element 42. In one example, each of the variable resistive elements R of the cross point resistive network 12 shown in FIG. 1 is provided in the same manner as the RRAM element 42 shown in FIG. 2. The RRAM element 42 includes a first electrode 44, a second electrode 46, and an insulating layer 48 provided between the first electrode 44 and the second electrode 46. The first electrode 44 and the second electrode 46 may be provided from any material suitable to provide RRAM elements. The insulating layer 48 may be formed from an oxide material(s) or any other type of suitable insulating material(s).

The RRAM element 42 has a variable conductance that is adjustable by applying a voltage pulse across the RRAM element. The change in the variable conductance depends on a temporal length of the voltage pulse. As shown, the RRAM element 42 is connected between the word line WL and the bit line BL. In this manner, the corresponding word line voltages VW representing the vector value $Z_j$ and the bit line voltage VB representing a vector value $r_j$ can adjust the variable conductance of the RRAM element 42. Since subarrays of the variable resistive elements R may be interconnected to provide the combined variable resistance representing one of the matrix values of the matrix D, the read inaccuracy can be high with small wire widths (e.g., W=20 nm), due to voltage drop on interconnects. Accordingly, wire widths W may be selected to be approximately 200 nm. The effect of the element spacing (S) on the read accuracy tends to be less prominent. Larger wire width W and smaller element spacing S (or wire pitch) reduce RC delay. However, the current overshoot due to element capacitance can be high when element spacing S is small. Therefore, in one embodiment, the element spacing S is provided to be approximately 1 μm.

Figure 3:
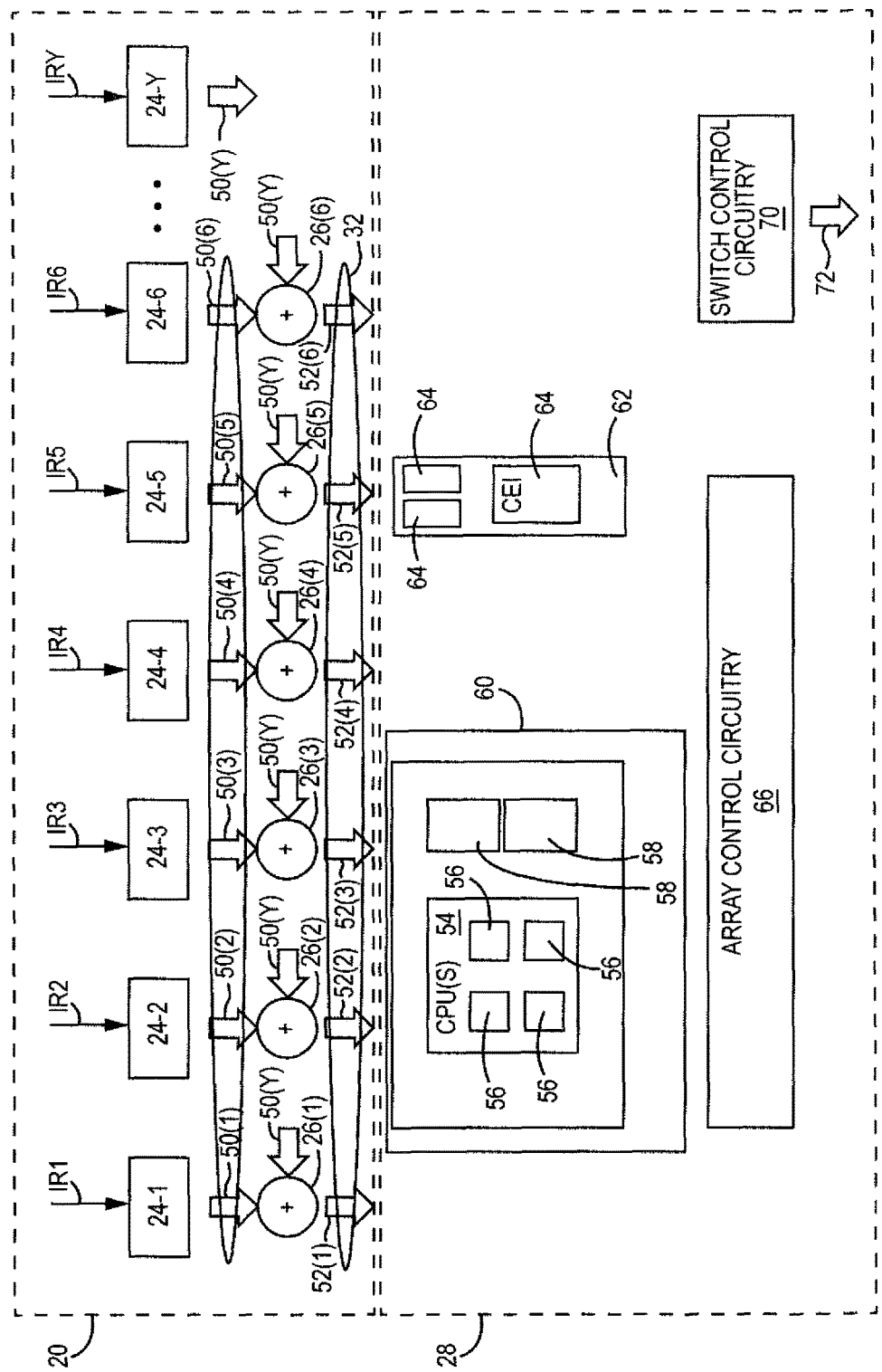
FIG. 3 illustrates exemplary peripheral digital processing circuitry that may be provided by the neuromorphic computational circuitry shown in FIG. 1.

FIG. 3 illustrates an example of the peripheral digital computational circuitry 28 operably associated with the word line control circuitry 18 and the bit line control circuitry 20 to the bit line control circuitry 20. A read circuit in each of the bit line controllers 24 is configured to generate digital values (referred to generically as digital values 50 and specifically digital vector values 50(1)-50(6) and digital correction value 50(Y)). The digital values 50(1)-50(6) are digital vectors values representing a current level of a corresponding one of the resultant bit line currents IR1-IR6. The digital value 50(Y) is a digital correction value representing a current level of the correction line current IRY. Each of the subtractors 26 receives a corresponding one of the digital vector values 50(1)-50(6) and the digital correction value 50(Y). Each of the subtracters 26 is configured to generate digital vector values (referred to generically as digital vectors values 52 and specifically as digital vector values 52(1)-52(6). The subtractors 26 are each configured to generate the digital vector values 52(1)-52(6) in accordance with a difference between the current level of a corresponding resultant line current IR1-IR6 of the resultant current levels and a current level of the correction line current IRY. In this manner, each of the digital vector values 52(1)-52(6) output from the substrators 26 is corrected by the digital correction value 50(Y) and thus for the off state conductance error.

More specifically, the subtractor 26-1 is configured to receive the digital vector value 50(1) generated by the read circuit of the bit line controller 24-1 and the digital correction value 50(Y) from the read circuit of the bit line controller 24-Y. The subtractor 26-1 is configured to subtract the digital correction value 50(Y) from the digital vector value 50(1) and generate a digital vector value 52(1) equal to the difference between digital vector value 50(1) and the digital correction value 50(Y). The subtractor 26-2 is configured to receive the digital vector value 50(2) generated by the read circuit of the bit line controller 24-2 and the digital correction value 50(Y) from the read circuit of the bit line controller 24-Y. The subtractor 26-2 is configured to subtract the digital correction value 50(Y) from the digital vector value 50(2) and generate a digital vector value 52(2) equal to the difference between digital vector value 50(2) and the digital correction value 50(Y). The subtractor 26-3 is configured to receive the digital vector value 50(3) generated by the read circuit of the bit line controller 24-3 and the digital correction value 50(Y) from the read circuit of the bit line controller 24-Y. The subtractor 26-3 is configured to subtract the digital correction value 50(Y) from the digital vector value 52-3 and generate a digital vector value 52(3) equal to the difference between digital vector value 50(3) from the read circuit of the bit line controller 24-3 and the digital correction value 50(Y). The subtractor 26-4 is configured to receive the digital vector value 50(4) generated by the read circuit of the bit line controller 24-4 and the digital correction value 50(Y) from the read circuit of the bit line controller 24-Y. The subtractor 26-4 is configured to subtract the digital correction value 50(Y) from the digital vector value 52-4 and generate a digital vector value 52(4) equal to the difference between digital vector value 50(4) from the read circuit of the bit line controller 24-4 and the digital correction value 50(Y). The subtractor 26-5 is configured to receive the digital vector value 50(5) generated by the read circuit of the bit line controller 24-5 and the digital correction value 50(Y) from the read circuit of the bit line controller 24-Y. The subtractor 26-5 is configured to subtract the digital correction value 50(Y) from the digital vector value 52-5 and generate a digital vector value 52(5) equal to the difference between digital vector value 50(5) from the read circuit of the bit line controller 24-5 and the digital correction value 50(Y). Finally, the subtractor 26-6 is configured to receive the digital vector value 50(6) generated by the read circuit of the bit line controller 24-6 and the digital correction value 50(Y) from the read circuit of the bit line controller 24-Y. The subtractor 26-6 is configured to subtract the digital correction value 50(Y) from the digital vector value 52-6 and generate a digital vector value 52(6) equal to the difference between digital vector value 50(6) from the read circuit of the bit line controller 24-6 and the digital correction value 50(Y). The resultant digital vector values (referred to generically as digital vector values 52) from the bit line controllers 24 are combined so that the bit line control circuitry 20 generates the resultant digital vector output 32. The resultant digital vector output 32 is received by the peripheral digital computational circuitry 28 to continue implementing the learning algorithm.

In this example, the peripheral digital computational circuitry 28 includes one or more central processing units (CPUs) 54, each including one or more processors 56. The CPU(s) 54 may have cache memory 58 coupled to the processor(s) 56 for rapid access to temporarily stored data. The CPU(s) 54 are coupled to a system bus 60 and can intercouple master and slave devices included in the peripheral digital computational circuitry 28. The system bus 60 may be a bus interconnect. As is well known, the CPU(s) 54 communicate with these other devices by exchanging address, control, and data information over the system bus 60. For example, the CPU(s) 54 can communicate bus transaction requests to a memory system 62. Although not illustrated in FIG. 3, multiple system buses 60 could be provided, wherein each system bus 60 constitutes a different fabric. Other master and slave devices can be connected to the system bus 60. The memory system 62 can include one or more memory units 64 configured to store computer executable instructions (CEI). The CEI are executable by the processors 56 and thus allow the neuromorphic computational circuitry NCC to perform the operations described herein using the resultant digital vector output 32. The peripheral digital computational circuitry 28 includes array control circuitry 66 that is operated by the CPU(s) 54 in order to perform the operations described in this disclosure. The array control circuitry 66 is configured to generate the digital vector output 30 that controls the operation of the word line control circuitry 18 and the bit line control circuitry 20 as described with regards to the operations discussed in this disclosure.

Referring now to FIG. 4 and FIG. 5A, FIG. 4 illustrates equations relevant to the operations for performing a learning algorithm. FIG. 5A illustrates exemplary steps in a sparse coding algorithm that may be performed by the neuromorphic computational circuitry NCC shown in FIG. 1. In the training phase, the input vector x, the matrix D, and the vector Z are trained iteratively by minimizing the objective error function E, which is shown as Equation (1) in FIG. 4. Stochastic Gradient Descent (SGD) is one of the most efficient algorithms that aims to minimize the reconstruction error:

$$\Sigma_t \lVert D \cdot Z - x \rVert^2$$

where minimizing the reconstruction error may be assumed to be sparse in many applications. To implement the learning algorithm, the matrix values of the matrix D are mapped into the combined variable conductances of the subsets of the variable resistive elements R of the cross point resistive network. Learning takes place by updating the matrix values of the matrix D and thus by adjusting the variable conductances of the variable resistive units (which in FIG. 1 are provided as individual ones of the variable resistive elements R).

The first term of Equation (1) in FIG. 4 generally measures how well the matrix D reconstructs the input data. The second term of Equation (1) imposes constraint of the sparsity of the feature vector. Since both matrix D and the resultant vector Z are unknown, the above optimization problem is a non-convex problem. We propose to alternatively optimize Z with fixed matrix D by the coordinate descent (CD) method and optimize D with fixed Z by the stochastic gradient descent (SGD) method, which converts the problem into a convex optimization problem. Using SGD, the D weight update process can be expressed as Equation (2) in FIG. 4.

It can be seen that D is modulated by the product of $\eta RZ^T$ where R is the reconstruction error, and $\eta$ is the learning rate. For the algorithm ideally implemented in software, the exact value of the equation above can be calculated and applied to update of the matrix D. However, the D update implemented on-chip needs to be translated to the number of pulses applied on the synaptic devices, and the effect of the programming pulses on the conductance of the devices may not represent the exact value of the equation above due to the realistic properties of synaptic devices as mentioned above. In this work, we model the weight update curve and incorporate this model in the D update code in the SC algorithm.

The update D operation is performed utilizing write circuits in the word line controllers 22 of the word line control circuitry 18 and write circuits in the bit line controllers 24 of the bit line control circuitry 20. Each of the matrix values of the matrix D may have a value range of the discrete values. For example, in one embodiment, each of the matrix values of the matrix D may be provided as any one of sixty four different values. The change in the matrix values of the matrix D is equal to:

$$\Delta D = \eta \cdot r \cdot Z.$$

The value $\eta$ is the learning rate. The change in the matrix D is thus proportional to the matrix multiplication of the resultant vector r·Z. Accordingly, the subarrays of resistive elements R are each configured to vary their respective combined variable conductance to discrete variable conductance levels that map to the discrete values within the value range. In this manner, the combined variable conductances of the subarrays of resistive elements can represent the matrix values of the D matrix. The change for each combined variable conductance can thus be represented by changing each of the combined variable conductances to equal approximately:

$$\Delta G_{ij} = \eta \cdot r_i \cdot Z_j$$

In this embodiment, the peripheral digital computational circuitry 28 does not calculate Z·r before programming. Instead, the word line control circuitry 18 is configured to generate the word line output onto the word lines WL and the bit line control circuitry 20 is configured to generate the bit line output onto the bit lines BL such that each of the plurality of combined variable conductances G provided by the subarrays is adjustable in parallel. To do this, the peripheral digital computational circuitry 28 is configured to generate the digital vector output 30 to represent the digital vector values of the vector r and to generate a digital vector output 34 to represent the digital vector values of the vector Z. The word line control circuitry 18 is configured to receive the digital vector output 30, and the bit line control circuitry 20 is configured to receive the digital vector output 34.

A combination of the word line controllers 22 generates a combination of the word line voltage VW, and a combination of the bit line controllers 24 will generate the bit line voltages VB. The combination of the word line controllers 22, the word line voltage VW, the bit line controllers 24, and bit line voltages VB will depend on the size of the variable resistive units selected to provide variable conductances, as explained above with regard to the D·Z operation and the $D^T \cdot r$ operation.

In the example shown in FIG. 1, all of the word line controllers 22 generate one of the word line voltages VW and the bit line controllers 24-1 to 24-6 generate one of the bit line voltages VB because the variable resistive units are each provided by individual variable resistive elements R.

Referring now to FIG. 4 and FIG. 5B, FIG. 5B describes the entire process flow that includes dictionary learning (training phase) and classification (testing phase). In this disclosure, MNIST handwriting digits is used as the training and testing data set, where the raw images are densely sampled into small patches with 10×10 pixels as The input vector x with a dimension of 100. In the later analyses, a set of 40 k images is used for training and a different set of 5 k images is used for testing. The size of Z is fixed at 300, thus the size of the D matrix is 100×300. Once the matrix D is trained, the matrix D is fixed as the trained dictionary Dtrain is used as a fixed D in the testing phase to generate the testing features {Ztest}. Before the classification process, a simple maximum pooling operation is employed on both the trained and testing features for each image to select the most active neuron of each feature node, and the output of maximum pooling results in one feature vector per image. Finally, to classify the 10 digits, the support vector machine (SVM) is used. With the input of testing labels, SVM performs classification and gives out the recognition accuracy.

To implement the SC algorithm on-chip, the precision of the matrix D and Z in the algorithm was limited. In the cross-point architecture, the values in the Z vector are stored on local memories in the peripheral digital computational circuitry 28, and the values in the D matrix value are represented by the conductance states of the variable resistive elements RD of the cross point resistive network 12 shown in FIG. 1. FIG. 4 shows the learning accuracy with different precisions by truncation of the bits in the SC algorithm. It suggests that a 4-bit Z is sufficient for high learning accuracy and limited precision of the matrix D has more impact on the accuracy. Since the number of bits D is related to how many levels of conductance the synaptic device can achieve, 6-bit values of the matrix D (64 levels) are chosen for later analysis based on the number of multi-level conductance states in today's variable resistive elements R (shown in FIG. 1).

The read accuracy is improved by resolving the problem regarding the non-zero minimum conductance state, as explained above. However, problems are also created by the non-linearity of the conductance state update. More specifically, for any particular variable resistive element R (shown in FIG. 1) the same pulse length or pulse cycle does not change the variable conductance of the variable resistive element R, by the same amount. As such, long-term potentiation (LTP) and long term depression (LTD) result in uneven changes in the variable conductance. Equation (3) in FIG. 4 describes the variable conductance $G_{LTP}$ of one of the variable resistive elements R (shown in FIG. 1) as the variable conductance state of the variable resistive element R is changed from the minimum conductance state $G_{min}$ to the maximum conductance state $G_{max}$. On the other hand, Equation (4) in FIG. 4 describes the variable conductance $G_{LTD}$ of one of the variable resistive elements R (shown in FIG. 1) as the variable conductance state of the variable resistive element R is changed from the maximum conductance state $G_{max}$ to the minimum conductance state $G_{min}$.

The maximum conductance state $G_{max}$, the minimum conductance state $G_{min}$ and and the maximum pulse number $P_{max}$ required to switch the device between the minimum and maximum conductance states are directly extracted empirically from the experimental data. The variable P is the number of pulses. The parameter A is the parameter that controls the nonlinear behavior of the weight update, and the parameter B is simply a function of the parameter A that fits the functions within the range of $G_{max}$, $G_{min}$ and $P_{max}$.

FIG. 6 illustrates curves describing the relationship between the variable conductance of one of the variable resistive elements R (shown in FIG. 1) as a function of an integer number n identifying conductance states. With regard to the curves LTP(1), LTP(2), LTP(3) illustrate when the variable conductance is adjusted between the minimum conductance state $G_{min}$ and the maximum conductance state $G_{max}$. The curves LTP(1), LTP(2), LTP(3) are each provided with different value of the parameter A. With regard to the curves LTD(1), LTD(2), LTD(3) illustrate when the variable conductance is adjusted between the maximum conductance state $G_{max}$ and the minimum conductance state $G_{min}$. The curves LTD(1), LTD(2), LTD(3) are each provided with a different value of the parameter A. The curve in the center is the ideal curve if there was no non-linearity in adjusting the variable conductance. By comparison with the ideal curve, the curves LTP(1), LTP(2), LTP(3), LTD(1), LTD(2), LTD(3) are clearly shown to be non-linear.

FIG. 6 thus illustrates the LTP and LTD behavior of updating the variable resistive elements R (shown in FIG. 1) as a function of the integer number n identifying the different conductance states. More specifically, the curve LTP(1) and the curve LPD(1) are provided when the parameter A has the same value. The curve LTP(2) and the curve LPD(2) are provided when the parameter A has the same value, but different than the value of the parameter A as provided for the curve LTP(1) and the curve LPD(1). The curve LTP(3) and the curve LPD(3) are provided when the parameter A has the same value, but different than the value of the parameter A as provided for the curve LTP(1) and the curve LPD(1) and different than the value of the parameter A as provided for the curve LTP(2) and the curve LPD(2). The curves pairs (LTP(1), LTD(1)), (LTP(2), LTD(2)), and (LTP(3), LTD(3)) demonstrate a hysteresis type behavior as the variable conductance is adjusted between the minimum conductance state $G_{min}$ to the maximum conductance state $G_{max}$ and then from the maximum conductance state $G_{max}$ to the minimum conductance state $G_{min}$. Thus, the change in the variable conductance state also depends on the direction of change (i.e., from a lower conductance state to a higher conductance state or from a higher conductance state to a lower conductance state). Accordingly, in order to change the conductance state of the variable resistive elements RD (shown in FIG. 1) consistently, the pulses utilized to adjust the variable conductance may need to be take into account the non-linear and hysteresis type behavior in order to achieve on the required recognition accuracy.

Another characteristic of the variable resistive elements R (shown in FIG. 1) that can lead to inaccuracies in calculations is spatial variation. Spatial variation refers to differences in behavior between the variable resistive elements R (shown in FIG. 1) due to their physical location. Spatial variation between the variable resistive elements R (shown in FIG. 1) causes drift and diffusion variation of ions and holes from device to device thereby resulting in different ones of the variable resistive elements R (shown in FIG. 1) following different non-linearity baselines.

FIG. 7A illustrates the effect of spatial variation on the recognition accuracy. More specifically, FIG. 7A illustrates curves that graph recognition accuracy versus the standard deviation of the variable conductance due to spatial variation. More specifically, curve SV1, curve SV2, curve SV3, and curve SV4 each are provided with different degrees of non-linearity in the variable conductance. The curve SV1 was provided in the ideal case with no non-linearity in the variable conductance (i.e., linear). The curve SV2 is provided with more non-linearity in the variable conductance curve than the curve SV1 but less than with the curves SV3, SV4. Curve SV3 is provided with more non-linearity in the variable conductance curve than the curves SV1, SV2 but less than with the curves SV4. Curve SV4 is provided with more non-linearity in the variable conductance curve than the curves SV1, SV2, SV3. As shown by comparing the curves SV1, SV2, SV3, SV4 in FIG. 7A, the effect of spatial variation does not have a large effect on recognition accuracy even at a standard deviation of 30% in comparison with the effect of non-linearity on learning accuracy. However, the effects of spatial variation are enhanced somewhat as non-linearity increases.

One possible reason that spatial variation does not have large effects is that the sparse coding algorithm can partially tolerate the spatial variation as the solution to the optimized D matrix is not unique. With the skewed weight update, the optimized D matrix may have converged at the next local minima as this is a non-convex problem. As long as such skew in weight update is deterministic and moderate, the cross point resistive network 12 (shown in FIG. 1) has the resilience to static variations in weight update. Note that other algorithms may not be as tolerant of spatial variation. Furthermore, although the effects of spatial variation do not seem to be great, they may be significant if the recognition accuracy required is very high. As such, other techniques may be implemented to ameliorate the effects of spatial variation when spatial variation is an issue, as explained in further detail below.

However, FIG. 7B illustrates the effects of another form of variation that does seem to have a more significant impact with some of the embodiments specifically disclosed. In particular, FIG. 7B illustrates the effects of temporal variation during variable conductance updates. The temporal variation is defined as the variation in the change of the variable conductance of one of the variable resistive elements R (shown in FIG. 1) as a result of variation in the temporal length of an applied voltage pulse used to change the variable conductance. More specifically, FIG. 7B illustrates curves that graph recognition accuracy versus the standard deviation of the variable conductance due to temporal variation. The curve TV1, curve TV2, curve TV3, and curve TV4 each are provided with different degrees of non-linearity in the variable conductance due to the effects of LTP and LTD. The curve TV1 was provided in the ideal case with no non-linearity in the variable conductance (i.e., linear). The curve TV2 is provided with more non-linearity in the variable conductance curve than the curve TV1 but less than with the curves TV3, TV4. Curve TV3 is provided with more non-linearity in the variable conductance curve than the curves TV1, TV2 but less than with the curves TV4. Curve TV4 is provided with more non-linearity in the variable conductance curve than the curves TV1, TV2, TV3. The curves TV1, TV2, TV2, TV4 in FIG. 7B show that larger temporal variation can have a significant effect on recognition accuracy which is exacerbated by non-linearity.

Temporal variation is inherently stochastic in nature and thus the SC algorithm has less resilience to these types of non-deterministic disturbances. Techniques may be utilized to ameliorate the effects of temporal variation as described in further detail below.

FIGS. 8A and 8B, FIGS. 9A and 9B, and FIGS. 10A and 10B illustrate different pulse schemes applied to each one of the variable resistive element R shown in FIG. 1 in order to change the variable conductance of the variable resistive element R from one conductance state to another conductance state. It should be noted that the pulse schemes in FIGS. 8A-10B are discussed with regards to individual variable resistive elements R (shown in FIG. 1) since with respect to FIG. 1, a matrix value of the D matrix is represented by a single variable resistive element R and therefore each variable resistive element R makes up a variable resistive unit. However, as explained below, groups (such as subarrays) of the variable resistive elements R may be used to represent a matrix value of the D matrix and thus the combined variable conductance of a group (e.g., subarrays) of the variable resistive elements R would be used to represent a matrix value of the D matrix. The techniques described herein are equally applicable to variable resistive units each having group (e.g., subarrays) of the variable resistive elements R. Furthermore, with regards to FIGS. 8A-10B, the variable resistive elements R are presumed to be $TaO_x/TiO_2$ RRAM elements.

Referring now to FIG. 8A and FIG. 8B, FIG. 8A and FIG. 8B illustrate a technique where a pulse train of pulses (referred to generically as pulses P8 and specifically as pulses P8A1, P8A2, P8A3, P8B1, P8B2, P8B3) are utilized to change the variable conductance of a variable resistive unit (i.e., a single variable resistive element R for the embodiment in FIG. 1) from one conductance state to another conductance state. Each of the pulses P8 in FIGS. 8A and 8B are approximately the same temporal length (e.g., 2 ms) and each of the pulses P8 change the variable conductance to an adjacent conductance state.

More specifically, FIG. 8A illustrate pulses P8A1, P8A2, P8A3 that each change the variable conductance of a variable resistive unit (i.e., a single variable resistive element R for the embodiment in FIG. 1) from one conductance state to the next highest conductance state. For the sake of clarity, the change from one conductance state to the next highest conductance state is referred to as an increasing conductance step $+\Delta GS$. The pulses P8A1, P8A2, P8A3 thus change the variable conductance of a variable resistive unit (i.e., a single variable resistive element R for the embodiment in FIG. 1) by three increasing conductance steps $+\Delta GS$. In particular, the pulse P8A1 changes the variable conductance of the variable resistive unit (i.e., a single variable resistive element R for the embodiment in FIG. 1) from a conductance state (referred to for the sake of clarity as conductance state 1) to the next highest conductance state (referred to for the sake of clarity as conductance state 2) and thus by one increasing conductance step $+\Delta GS$. The pulse P8A2 changes the variable conductance of the variable resistive unit (i.e., the single variable resistive element R for the embodiment in FIG. 1) from that conductance state (e.g., conductance state 2) to the next highest conductance state (referred to for the sake of clarity as conductance state 3) and thus by one increasing conductance step $+\Delta GS$. Finally, the pulse P8A3 changes the variable conductance of the variable resistive unit (i.e., the single variable resistive element R for the embodiment in FIG. 1) from that conductance state (e.g., conductance state 3) to the next highest conductance state (referred to for the sake of clarity as conductance state 4).

Each of the pulses P8A1, P8A2, P8A3 is the same temporal length (e.g., 2 ms in the specific embodiment shown in FIG. 8A) and has the same positive voltage magnitude (e.g., 2.8V in the specific embodiment shown in FIG. 8A). The pulses P8A1, P8A2, P8A3 are all provided during one conductance update cycle in order change the variable conductance of the variable resistive unit (i.e., the single variable resistive element R for the embodiment in FIG. 1) by three increasing conductance steps $+\Delta GS$. Clearly, FIG. 8A is simply an example as more or less of the pulses P8A1, P8A2, P8A3 may be provided if the variable conductance is changed by more or less than three increasing conductance steps $+\Delta GS$. Obviously then, the number of pulses provided during a conductance update cycle is dependent on the number of conductance states (e.g., for example three with regard to the example in FIG. 8A) between the conductance state (e.g., conductance state 1) at the beginning of the conductance update cycle and the target conductance state (e.g., conductance state 4) at the end of the conductance update cycle.

With regard to FIG. 8B, FIG. 8B illustrate pulses P8B1, P8B2, P8B3 that each change the variable conductance of a variable resistive unit (i.e., a single variable resistive element R for the embodiment in FIG. 1) from one conductance state to the next lowest conductance state. For the sake of clarity, the change from one conductance state to the next lowest conductance state is referred to as a decreasing conductance step $-\Delta GS$. The pulses P8B1, P8B2, P8B3 thus change the variable conductance of a variable resistive unit (i.e., a single variable resistive element R for the embodiment in FIG. 1) by three decreasing conductance steps $-\Delta GS$. In particular, the pulse P8B1 changes the variable conductance of the variable resistive unit (i.e., a single variable resistive element R for the embodiment in FIG. 1) from a conductance state (e.g., conductance state 4) to the next lowest conductance state (e.g., conductance state 3) and thus by one decreasing conductance step $-\Delta GS$. The pulse P8B2 changes the variable conductance of the variable resistive unit (i.e., the single variable resistive element R for the embodiment in FIG. 1) from that conductance state (e.g., conductance state 3) to the next lowest conductance state (e.g., conductance state 2) and thus by one decreasing conductance step $-\Delta GS$. Finally, the pulse P8B3 changes the variable conductance of the variable resistive unit (i.e., the single variable resistive element R for the embodiment in FIG. 1) from that conductance state (e.g., conductance state 2) to the next lowest conductance state (e.g., conductance state 1).

Each of the pulses P8B1, P8B2, P8B3 is the same temporal length (e.g., 2 ms in the specific embodiment shown in FIG. 8B) and has the same negative voltage magnitude (e.g., $-2.8V$ in the specific embodiment shown in FIG. 8B). The pulses P8B1, P8B2, P8B3 are all provided during one conductance update cycle in order change the variable conductance of the variable resistive unit (i.e., the single variable resistive element R for the embodiment in FIG. 1) by three decreasing conductance steps $-\Delta GS$. Clearly, FIG. 8B is simply an example as more or less of the pulses P8B1, P8B2, P8B3 may be provided if the variable conductance is changed by more or less than three decreasing conductance steps $-\Delta GS$. Obviously then, the number of pulses provided during a conductance update cycle is dependent on the number of conductance states (e.g., for example three with regard to the example in FIG. 8B) between the conductance state (e.g., conductance state 4) at the beginning of the conductance update cycle and the target conductance state (e.g., conductance state 1) at the end of the conductance update cycle.

Referring now to FIG. 9A and FIG. 9B, FIG. 9A and FIG. 9B illustrate a technique where a pulse train of pulses (referred to generically as pulses P9 and specifically as pulses P9AP1, P9AN1, P9AP2, P9AN2, P9BN1, P9BP1, P9BN2, P9BP2) are utilized to change the variable conductance of a variable resistive unit (i.e., a single variable resistive element R for the embodiment in FIG. 1) from a current conductance state to a target conductance state. The pulses P9 in FIGS. 9A and 9B are provided in pairs of temporally adjacent pulses P9, where each pair of the pulses P9 has a positive pulse (e.g., P9AP1, P9AP2, P9BP1, P9BP2) and a negative pulse (e.g., P9AN1, P9AN2, P9BN1, P9BN2).

With respect to FIG. 9A, FIG. 9A illustrates pulses P9AP1, P9AN1, P9AP2, P9AN2. The pulse P9AP1 and the pulse P9AP2 are each positive pulses having the same temporal length (e.g., 10 ms in FIG. 9A) and positive voltage amplitude (e.g., 3V in FIG. 9A). The pulse P9AN1 and the pulse P9AN2 are each negative pulses having the same temporal length (e.g., 5 ms in FIG. 9A) and negative voltage amplitude (e.g., −2V in FIG. 9A). The temporal length (e.g., 10 ms) of the positive pulses P9AP1, P9AP2 is greater than the temporal length (e.g. 5 ms) of the negative pulses P9AN1, P9AN2. Furthermore, a voltage magnitude (e.g., |3V|) of the positive pulses P9AP1, P9AP2 is greater than of the voltage magnitude (e.g., |2V|) of the voltage amplitude of the negative pulses P9AN1, P9AN2.

The pulse P9AP1 and the pulse P9AN1 (referred to collectively as pulse pair PP1) are a pair of temporally adjacent pulses used to change the variable conductance of a variable resistive unit (i.e., a single variable resistive element R for the embodiment in FIG. 1) from one conductance state to the next highest conductance state and thus an increasing conductance step $+\Delta GS$. Furthermore, pulse P9AP2 and the pulse P9AN2 (referred to collectively as pulse pair PP2) are also a pair of temporally adjacent pulses used to change the variable conductance of a variable resistive unit (i.e., a single variable resistive element R for the embodiment in FIG. 1) from one conductance state to the next highest conductance state and thus an increasing conductance step $+\Delta GS$. Together the pulse pairs PP1, PP2 thus change the variable conductance of a variable resistive unit (i.e., a single variable resistive element R for the embodiment in FIG. 1) by two increasing conductance steps $+\Delta GS$. In particular, the pulse pair PP1 changes the variable conductance of the variable resistive unit (i.e., a single variable resistive element R for the embodiment in FIG. 1) from a conductance state (e.g., conductance state 1) to the next highest conductance state (e.g., conductance state 2) and thus by one increasing conductance step $+\Delta GS$. Additionally, the pulse PP2 changes the variable conductance of the variable resistive unit (i.e., the single variable resistive element R for the embodiment in FIG. 1) from that conductance state (e.g., conductance state 2) to the next highest conductance state (e.g., conductance state 3) and thus by another increasing conductance step $+\Delta GS$.

The pulse pairs PP1, PP2 are all provided during one conductance update cycle in order change the variable conductance of the variable resistive unit (i.e., the single variable resistive element R for the embodiment in FIG. 1) by two increasing conductance steps $+\Delta GS$. Clearly, FIG. 9A is simply an example as more or less of the pulse pairs PP1, PP2 may be provided if the variable conductance is changed by more or less than three increasing conductance steps $+\Delta GS$. Obviously then, the number of pulse pairs provided during a conductance update cycle is dependent on the number of conductance states (e.g., for example two with regard to the example in FIG. 9A) between the conductance state (e.g., conductance state 1) at the beginning of the conductance update cycle and the target conductance state (e.g., conductance state 3) at the end of the conductance update cycle.

With respect to FIG. 9B, FIG. 9B illustrates pulses P9BP1, P9BN1, P9BP2, P9BN2. The pulse P9BP1 and the pulse P9BP2 are each negative pulses having the same temporal length (e.g., 10 ms in FIG. 9B) and negative voltage amplitude (e.g., −3V in FIG. 9B). The pulse P9BN1 and the pulse P9BN2 are each positive pulses having the same temporal length (e.g., 5 ms in FIG. 9B) and positive voltage amplitude (e.g., 2V in FIG. 9B). The temporal length (e.g., 10 ms) of the negative pulses P9BP1, P9BP2 is greater than the temporal length (e.g. 5 ms) of the positive pulses P9BN1, P9BN2. Furthermore, a voltage magnitude (e.g., |3V|) of the negative pulses P9BP1, P9BP2 is greater than of the voltage magnitude (e.g., |2V|) of the voltage amplitude of the positive pulses P9BN1, P9BN2.

The pulse P9BP1 and the pulse P9BN1 (referred to collectively as pulse pair PN1) are a pair of temporally adjacent pulses used to change the variable conductance of a variable resistive unit (i.e., a single variable resistive element R for the embodiment in FIG. 1) from one conductance state to the next lowest conductance state and thus a decreasing conductance step $-\Delta GS$. Furthermore, pulse P9BP2 and the pulse P9BN2 (referred to collectively as pulse pair PN2) are also a pair of temporally adjacent pulses used to change the variable conductance of a variable resistive unit (i.e., a single variable resistive element R for the embodiment in FIG. 1) from one conductance state to the next lowest conductance state and thus a decreasing conductance step $-\Delta GS$. Together the pulse pairs PN1, PN2 thus change the variable conductance of a variable resistive unit (i.e., a single variable resistive element R for the embodiment in FIG. 1) by two decreasing conductance steps $-\Delta GS$. In particular, the pulse pair PN1 changes the variable conductance of the variable resistive unit (i.e., a single variable resistive element R for the embodiment in FIG. 1) from a conductance state (e.g., conductance state 3) to the next lowest conductance state (e.g., conductance state 2) and thus by one decreasing conductance step $-\Delta GS$. Additionally, the pulse PN2 changes the variable conductance of the variable resistive unit (i.e., the single variable resistive element R for the embodiment in FIG. 1) from that conductance state (e.g., conductance state 2) to the next lowest conductance state (e.g., conductance state 1) and thus by another decreasing conductance step $-\Delta GS$.

The pulse pairs PN1, PN2 are all provided during one conductance update cycle in order change the variable conductance of the variable resistive unit (i.e., the single variable resistive element R for the embodiment in FIG. 1) by two decreasing conductance steps $-\Delta GS$. Clearly, FIG. 9B is simply an example as more or less of the pulse pairs PN1, PN2 may be provided if the variable conductance is changed by more or less than three decreasing conductance steps $-\Delta GS$. Obviously then, the number of pulse pairs provided during a conductance update cycle is dependent on the number of conductance states (e.g., for example two with regard to the example in FIG. 9B) between the conductance state (e.g., conductance state 3) at the beginning of the conductance update cycle and the target conductance state (e.g., conductance state 1) at the end of the conductance update cycle.

Referring now to FIG. 10A and FIG. 10B, FIG. 10A and FIG. 10B illustrate a technique where a pulse train of pulses (referred to generically as pulses P10 and specifically as pulses P10A1, P10A2, P10B1, P10B2) are utilized to change the variable conductance of a variable resistive unit (i.e., a single variable resistive element R for the embodiment in FIG. 1) from one conductance state to another conductance state. Each of the pulses P10 in FIGS. 10A and 10B are approximately the same temporal length (e.g., 2 ms) and each of the pulses P10 change the variable conductance to an adjacent conductance state.

More specifically, FIG. 10A illustrate pulses P10A1, P10A2 that each change the variable conductance of a variable resistive unit (i.e., a single variable resistive element R for the embodiment in FIG. 1) from one conductance state to the next highest conductance state. For the sake of clarity, the change from one conductance state to the next highest conductance state is referred to as an increasing conductance step $+\Delta GS$. The pulses P10A1, P10A2 thus change the variable conductance of a variable resistive unit (i.e., a single variable resistive element R for the embodiment in FIG. 1) by two increasing conductance steps $+\Delta GS$. In particular, the pulse P10A1 changes the variable conductance of the variable resistive unit (i.e., a single variable resistive element R for the embodiment in FIG. 1) from a conductance state (referred to for the sake of clarity as conductance state 1) to the next highest conductance state (referred to for the sake of clarity as conductance state 2) and thus by one increasing conductance step $+\Delta GS$. The pulse P10A2 changes the variable conductance of the variable resistive unit (i.e., the single variable resistive element R for the embodiment in FIG. 1) from that conductance state (e.g., conductance state 2) to the next highest conductance state (referred to for the sake of clarity as conductance state 3) and thus by one increasing conductance step $+\Delta GS$. Finally, the pulse P10A3 changes the variable conductance of the variable resistive unit (i.e., the single variable resistive element R for the embodiment in FIG. 1) from that conductance state (e.g., conductance state 3) to the next highest conductance state (referred to for the sake of clarity as conductance state 4).

Each of the pulses P10A1, P10A2 has the same positive voltage magnitude (e.g., 3V in the specific embodiment shown in FIG. 10A). The pulses P10A1, P10A2 are all provided during one conductance update cycle in order change the variable conductance of the variable resistive unit (i.e., the single variable resistive element R for the embodiment in FIG. 1) by two increasing conductance steps $+\Delta GS$. Clearly, FIG. 10A is simply an example as more or less of the pulses P10A1, P10A2 may be provided if the variable conductance is changed by more or less than two increasing conductance steps $+\Delta GS$. Obviously then, the number of pulses provided during a conductance update cycle is dependent on the number of conductance states (e.g., for example two with regard to the example in FIG. 10A) between the conductance state (e.g., conductance state 1) at the beginning of the conductance update cycle and the target conductance state (e.g., conductance state 3) at the end of the conductance update cycle.

However, the pulses P10A1, P10A2 each have a different temporal duration. The temporal duration of the P10A1, P10A2 is determined by Equation (6) in FIG. 4. In Equation (6), the pulse duration ($P_D$) is empirically determined in accordance with an initial pulse duration ($P_i$), the current conductance state, and an integer m that indicates a non-linearity factor. An integer n is an integer that identifies the current conductance state by providing an integer number that identifies where the current conductance state ranks relative to an ordered set of all of the possible conductance states. For example, when Equation (6) is used for potentiation to increase the conductance state, the lowest integer value of zero (0) of n indicates the minimum conductance state $G_{min}$ while the highest integer value of n (e.g., 63 if there are 64 possible conductance states) indicates the maximum conductance state $G_{max}$. Each of the possible integer values (e.g., 1-62) of n between the lowest integer value (0) to the highest integer value indicate conductance states between the minimum conductance state $G_{min}$ and the maximum conductance state $G_{max}$ where increasing integer values of n increase correspond bijectively to increasing conductance states between the minimum conductance state $G_{min}$ and the maximum conductance state $G_{max}$. Accordingly, the integer value (n+1) indicates the integer value identifying the next highest conductance state greater than the current conductance state. The initial pulse duration $P_i$ indicates the temporal duration required to change the variable conductance from the minimum conductance state $G_{min}$ to the lowest possible conductance state (indicated by n=1) greater than the minimum conductance state $G_{min}$. Finally, the integer value m is empirically determined and in this example is equal to 6.

With regard to FIG. 10B, FIG. 10B illustrate pulses P10B1, P10B2, that each change the variable conductance of a variable resistive unit (i.e., a single variable resistive element R for the embodiment in FIG. 1) from one conductance state to the next lowest conductance state. For the sake of clarity, the change from one conductance state to the next lowest conductance state is referred to as a decreasing conductance step $-\Delta GS$. The pulses P10B1, P10B2 thus change the variable conductance of a variable resistive unit (i.e., a single variable resistive element R for the embodiment in FIG. 1) by two decreasing conductance steps $-\Delta GS$. In particular, the pulse P10B1 changes the variable conductance of the variable resistive unit (i.e., a single variable resistive element R for the embodiment in FIG. 1) from a conductance state (e.g., conductance state 3) to the next lowest conductance state (e.g., conductance state 2) and thus by one decreasing conductance step $-\Delta GS$. The pulse P10B2 changes the variable conductance of the variable resistive unit (i.e., the single variable resistive element R for the embodiment in FIG. 1) from that conductance state (e.g., conductance state 2) to the next lowest conductance state (e.g., conductance state 1) and thus by another decreasing conductance step $-\Delta GS$.

Each of the pulses P10B1, P10B2 has the same negative voltage magnitude (e.g., −2.5V in the specific embodiment shown in FIG. 10B). The pulses P10B1, P10B2 are all provided during one conductance update cycle in order change the variable conductance of the variable resistive unit (i.e., the single variable resistive element R for the embodiment in FIG. 1) by two increasing conductance steps $+\Delta GS$. Clearly, FIG. 10B is simply an example as more or less of the pulses P10B1, P10B2 may be provided if the variable conductance is changed by more or less than two increasing conductance steps $+\Delta GS$. Obviously then, the number of pulses provided during a conductance update cycle is dependent on the number of conductance states (e.g., for example two with regard to the example in FIG. 10B) between the conductance state (e.g., conductance state 1) at the beginning of the conductance update cycle and the target conductance state (e.g., conductance state 3) at the end of the conductance update cycle.

However, the pulses P10B1, P10B2 each have a different temporal duration. The temporal duration of the P10B1, P10B2 is also determined by Equation (6) in FIG. 4. In Equation (6), the pulse duration ($P_D$) is empirically determined in accordance with an initial pulse duration ($P_i$), the current conductance state, and an integer m that indicates a non-linearity factor. The integer n identifies the current conductance state by providing an integer number that identifies where the current conductance state ranks relative to an ordered set of all of the possible conductance states. However, when Equation (6) is used for depression to decrease the conductance state, the lowest integer value of zero (0) of n indicates the maximum conductance state $G_{max}$ while the highest integer value of n (e.g., 63 if there are 64 possible conductance states) indicates the minimum conductance state $G_{min}$. Each of the possible integer values (e.g., 1-62) of n between the lowest integer value (0) to the highest integer value (e.g. 63) indicate conductance states between the maximum conductance state $G_{max}$ and the minimum conductance state $G_{min}$ where increasing integer values of n increase correspond bijectively to decreasing conductance states between the maximum conductance state $G_{max}$ and the minimum conductance state $G_{min}$. Accordingly, the integer value (n+1) indicates the integer value identifying the next lowest conductance state less than the current conductance state. The initial pulse duration $P_i$ indicates the temporal duration required to change the variable conductance from the maximum conductance state $G_{max}$ to the highest possible conductance state (indicated by n=1) lower than the maximum conductance state $G_{max}$. Finally, the integer value m is empirically determined and in this example is equal to 4.

FIG. 11 illustrates exemplary curves CV8A, CV8B, CV9A, CV9B, CV10A, CV10B of FIG. 11 that graph a normalized variable conductance of a variable resistive unit (i.e., the single variable resistive element R for the embodiment in FIG. 1) as a function of the integer n indicating the conductance state. Curve CV8A is the result of adjusting the variable conductance state from the minimum conductance state $G_{min}$ to the maximum conductance state $G_{max}$ using the pulse scheme described above with respect to FIG. 8A. Curve CV8B is the result of adjusting the variable conductance state from the maximum conductance state $G_{max}$ to the minimum conductance state $G_{min}$ using the pulse scheme described above with respect to FIG. 8B. Curve CV9A is the result of adjusting the variable conductance state from the minimum conductance state $G_{min}$ to the maximum conductance state $G_{max}$ using the pulse scheme described above with respect to FIG. 9A. Curve CV9B is the result of adjusting the variable conductance state from the maximum conductance state $G_{max}$ to the minimum conductance state $G_{min}$ using the pulse scheme described above with respect to FIG. 9B. Curve CV10A is the result of adjusting the variable conductance state from the minimum conductance state $G_{min}$ to the maximum conductance state $G_{max}$ using the pulse scheme described above with respect to FIG. 10A. Curve CV10B is the result of adjusting the variable conductance state from the maximum conductance state $G_{max}$ to the minimum conductance state $G_{min}$ using the pulse scheme described above with respect to FIG. 10B.

Accordingly, the pulse scheme utilized to change the variable conductance in FIG. 8A and FIG. 8B uses a simple pulse train for both the potentiation and depression where each of the pulses (e.g., the pulses P8A1, P8A2, P8A3 shown in FIG. 8A) for potentiation are substantially identical and each of the pulses (e.g., the pulses P8B1, P8B2, P8B3 shown in FIG. 8B) for depression are substantially identical. This results in the greatest non-linearity as the amount of change in the variable conductance between adjacent conductance states will be different due to non-linearity of the variable conductance and the fact that the pulses are all the same temporal duration. For example, an amount of increase in the variable conductance due to each increasing conductance step +ΔGS using the pulse scheme described above with respect FIG. 8A will be substantially different depending on which conductance state is the current conductance state. Additionally, an amount of the matrix Decrease in the variable conductance due to each decreasing conductance step −ΔGS using the pulse scheme described above with respect FIG. 8B will also be substantially different depending on which conductance state is the current conductance state.

Next, the pulse scheme utilized to change the variable conductance in FIG. 9A and FIG. 9B uses pulse pairs (e.g., the pulses PP1, PP2 in FIG. 9A) for potentiation and pulse pairs (e.g., the pulses PN1, PN2 in FIG. 9B) for depression. The pulse pair helps ameliorate the drift and diffusion variation of ions and holes resulting from spatial and temporal variation and thereby reduces non-linearity. However, non-linearity still remains and thus also results in the amount of change in the variable conductance between adjacent conductance states being different. For example, an amount of increase in the variable conductance due to each increasing conductance step +ΔGS using the pulse scheme described above with respect FIG. 9A will be substantially different depending on which conductance state is the current conductance state. Additionally, an amount of increase in the variable conductance due to each decreasing conductance step −ΔGS using the pulse scheme described above with respect FIG. 9B will also be substantially different depending on which conductance state is the current conductance state. As shown by FIG. 11, the pulse schemes described in FIGS. 9A and 9B have the less non-linearity than the pulse scheme described in FIGS. 8A and 8B. Since the pulse schemes described in FIGS. 9A and 9B have some resilience to spatial and temporal variation, the pulse scheme described by FIGS. 9A and 9B could be utilized in some practical implementations.

Finally, the pulse scheme utilized to change the variable conductance in FIG. 10A and FIG. 10B uses a simple pulse train for both the potentiation and depression where a pulse duration of each of the pulses (e.g., the pulses P10A1, P10A2, shown in FIG. 10A) for potentiation and each of the pulses (e.g., the pulses P10B1, P10B2, P10B3 shown in FIG. 10B) for depression are determined in accordance with Equation (6), which takes into account non-linearity resulting from spatial and temporal variation. Accordingly, curves CV10A and CV10B are substantially linear. This results in an amount of increase in the variable conductance due to each increasing conductance step +ΔGS using the pulse scheme described above with respect FIG. 10A being substantially the same. Additionally, an amount of the matrix Decrease in the variable conductance due to each decreasing conductance step −ΔGS using the pulse scheme described above with respect FIG. 10B will also be substantially the same.

However, to provide this non-linearity, the peripheral digital computational circuitry 28 (shown in FIG. 1) needs to make a conductance measurement indicating the current conductance state of the variable resistive unit (i.e., the single variable resistive element R for the embodiment in FIG. 1) before changing the current conductance state of the variable resistive unit. The peripheral digital computational circuitry 28 is configured to determine the target conductance state of the variable resistive unit (i.e., the single variable resistive element R for the embodiment in FIG. 1) in accordance with the learning algorithm described above.

Once the conductance measurement is provided and the target conductance state has been determined, the peripheral digital computational circuitry 28 is configured to determine the pulse duration of each the pulses in accordance to Equation (6). From the conductance measurement, the peripheral digital computational circuitry 28 can determine the current conductance state and thus the current integer value of n that identifies the current conductance state. Using the current integer value of n based on the conductance measurement, the peripheral digital computational circuitry 28 is configured to determine the temporal duration of the initial pulse to be generated during the conductance update cycle needed to change the current conductance state to the next highest conductance state (in case of potentiation) or the next lowest conductance state (in the case of the matrix Depression). If other pulses in addition to the first pulse are needed to change the current conductance state to the target conductance state during a conductance update cycle, the pulse duration of each of these pulses is also determined in accordance with Equation (6). However, the integer value of n for these pulses is determined in accordance to Equation (6) simply incrementing the integer value of n determined from the conductance measurement. Thus, the duration of each of the pulses generated during a conductance update cycle is also based on the conductance measurement. The pulse schemes described above with respect to FIGS. 10A and 10B are thus clearly the pulse schemes with the greatest recognition accuracy that can provide the most recognition accuracy. However, pulse schemes described above with respect to FIGS. 10A and 10B are a more complicated because these pulse schemes require a read before write step to determine the current conductance state of the variable resistive unit.

FIG. 12 illustrates another exemplary embodiment of the neuromorphic computational circuitry NCC having another embodiment of the resistive memory system 10 that is configured to implement matrix vector product operations and weight update operations in parallel. The resistive memory system 10 shown in FIG. 12 includes the cross point resistive network 12, the word line control circuitry 70, the bit line control circuitry 20 and the peripheral digital computational circuitry 28 described above with respect to FIG. 1. However, the resistive memory system 10 shown in FIG. 12 includes switchable paths WS12, WS23, WS34, WS45, WS56, WSX-1X, BS12, BS23, BS34, BS45, BS56, and BSY-1Y (referred to generically as switchable paths W/BS). Thus, unlike the resistive memory system 10 shown in FIG. 1, the resistive memory system 10 shown in FIG. 12 can represent the matrix values of the matrix D with either just the variable conductance of individual variable resistive elements (like the resistive memory system 10 shown in FIG. 1) or with a combined variable conductance of groups of the individual resistive elements R. Accordingly, a variable resistive unit in FIG. 12 can be provided as either an individual variable resistive element or with a group (e.g., subarrays) of the variable resistive elements R.

With respect to the bit line control circuitry 20, the bit line switch SB1 is connected between the bit line controller 24-1 and the bit line BL1. The bit line switch SB2 is connected between the bit line controller 24-2 and the bit line BL2. The bit line switch SB3 is connected between the bit line controller 24-3 and the bit line BL3. The bit line switch SB4 is connected between the bit line controller 24-4 and the bit line BL4. The bit line switch SB5 is connected between the bit line controller 24-5 and the bit line BL5. The bit line switch SB6 is connected between the bit line controller 24-6 and the bit line BL6. The bit line switch SBY is connected between the bit line controller 24-Y and the bit line BLY.

Each of the word line switches SW and each of the bit line switches SB is configured to be opened and closed. In this manner, the switch control circuitry 70 is configured to generate a switch control output 72 that is configured to open and close the word line switches SW and the bit line switches SB based on the size of the subarrays selected by the switch control output 72. In this manner, the peripheral digital computational circuitry 28 (shown in FIG. 3) is configured to change arrangement of the variable resistive elements R that provide a variable resistive unit. The word line controllers 22 are interconnected by the word line switches SW to the word lines WL so that one of the word line controllers 22 is provided per row of subarrays while the remainder of the word line controllers 22 per row of subarrays are decoupled by the word line switches SW. The bit line controllers 24 are interconnected by the bit line switches SB to the bit lines BL so that one of the bit line controllers 24 is provided per column of subarrays while the remainder of the bit line controllers 24 per column of subarrays are decoupled by the bit line switches SB.

To demonstrate, in one exemplary implementation, all of the switchable paths W/BS are open, and thus the variable conductance of each of the switchable paths W/BS represents a different corresponding matrix value of the matrix D. In exemplary implementation, the integer number m of the matrix D would be equal to X, and the integer number p of the matrix D would be equal to Y. However, the switchable paths W/BS are connected to the conductive lines W/BL so that the plurality of switchable paths W/BS are operable to selectively interconnect one or more groups of the conductive lines W/BL such that one or more sets of the variable resistive elements R provide one or more combined variable conductances. Thus, each set of the variable resistive elements R has a combined variable conductance, which can be used to represent one of the matrix values of the matrix D. Thus, multiple variable resistive elements R can be used to represent a single matrix value of the matrix D and thus multiple variable resistive elements R provide a variable resistive unit. This is advantageous because the combined variable conductance of multiple resistive elements R averages out process variations in the variable conductance of the individual resistive elements R. Thus, by using multiple resistive elements R to represent each matrix value of the matrix D, the impact of both temporal and spatial variation can be significantly reduced. However, the techniques and methods for operating the resistive memory system 10 shown in FIG. 12 are the same as described above for the resistive memory system 10 shown in FIG. 1 and described above with respect to FIGS. 1-11.

Nevertheless, using multiple resistive elements R to represent each matrix value of the matrix D can have an impact on energy requirements, area requirements, and latency. Accordingly, the switchable paths W/BS are operable to selectively interconnect different combinations of the conductive lines W/BL of the variable resistive elements R so that the sets of variable resistive elements R are reconfigurable as different combinations of the variable resistive elements R. Thus, the switchable paths W/BS allow for optimization of the resistive memory system 10. More specifically, each of the switchable paths W/BS is configured to be opened and closed and is connected between a corresponding pair of the conductive lines W/BL. When one of the switchable paths W/BS is opened, the pair of conductive lines W/BL it is connected to is decoupled, and thus the pair of conductive lines W/BL operates as separate conductive lines W/BL. However, when the switchable conductive paths are closed, the pair of conductive lines W/BL is interconnected, and thus the variable resistive elements R can be grouped to provide the combined variable conductance.

In the embodiment shown in FIG. 12, the switchable paths W/BS include switchable word line interconnection paths WS12, WS23, WS34, WS45, WS56, WSX-1X (referred to generically as switchable word line interconnection paths WS) and switchable bit line interconnection paths BS12, BS23, BS34, BS45, BS56, and BSY-1Y (referred to generically as switchable word line interconnection paths BS). More specifically, the switchable word line interconnection path WS12 is connected between the word line WL1 and the word line WL2. The switchable word line interconnection path WS12 is configured to selectively interconnect the word line WL1 and the word line WL2. As such, when the switchable word line interconnection path WS12 is open, the word line WL1 and the word line WL2 are decoupled. However, when the switchable word line interconnection path WS12 is closed, the word line WL1 and the word line WL2 are interconnected and thus essentially operate as a merged word line.

The switchable word line interconnection path WS23 is connected between the word line WL2 and the word line WL3. The switchable word line interconnection path WS23 is configured to selectively interconnect the word line WL2 and the word line WL3. As such, when the switchable word line interconnection path WS23 is open, the word line WL2 and the word line WL3 are decoupled. However, when the switchable word line interconnection path WS23 is closed, the word line WL2 and the word line WL3 are interconnected and thus essentially operate as a merged word line.

The switchable word line interconnection path WL34 is connected between the word line WL3 and the word line WL4. The switchable word line interconnection path WL34 is configured to selectively interconnect the word line WL3 and the word line WL4. As such, when the switchable word line interconnection path WL34 is open, the word line WL3 and the word line WL4 are decoupled. However, when the switchable word line interconnection path WL34 is closed, the word line WL3 and the word line WL4 are interconnected and thus essentially operate as a merged word line.

The switchable word line interconnection path WS45 is connected between the word line WL4 and the word line WL5. The switchable word line interconnection path WS45 is configured to selectively interconnect the word line WL4 and the word line WL5. As such, when the switchable word line interconnection path WS45 is open, the word line WL4 and the word line WL5 are decoupled. However, when the switchable word line interconnection path WS45 is closed, the word line WL4 and the word line WL5 are interconnected and thus essentially operate as a merged word line.

The switchable word line interconnection path WS56 is connected between the word line WL5 and the word line WL6. The switchable word line interconnection path WS56 is configured to selectively interconnect the word line WL5 and the word line WL6. As such, when the switchable word line interconnection path WS56 is open, the word line WL5 and the word line WL6 are decoupled. However, when the switchable word line interconnection path WS56 is closed, the word line WL5 and the word line WL6 are interconnected and thus essentially operate as a merged word line.

The switchable word line interconnection path WSX-1X is connected between the word line WLX-1 (not explicitly shown in FIG. 12) and the word line WLX. The switchable word line interconnection path WSX-1X is configured to selectively interconnect the word line WLX-1 and the word line WLX. As such, when the switchable word line interconnection path WSX-1X is open, the word line WLX-1 and the word line WLX are decoupled. However, when the switchable word line interconnection path WSX-1X is closed, the word line WLX-1 and the word line WLX are interconnected and thus essentially operate as a merged word line.

The switchable bit line interconnection path BS12 is connected between the bit line BL1 and the bit line BL2. The switchable bit line interconnection path BS12 is configured to selectively interconnect the bit line BL1 and the bit line BL2. As such, when the switchable bit line interconnection path BS12 is open, the bit line BL1 and the bit line BL2 are decoupled. However, when the switchable bit line interconnection path BS12 is closed, the bit line BL1 and the bit line BL2 are interconnected and thus essentially operate as a merged bit line.

The switchable bit line interconnection path BS23 is connected between the bit line BL2 and the bit line BL3. The switchable bit line interconnection path BS23 is configured to selectively interconnect the bit line BL2 and the bit line BL3. As such, when the switchable bit line interconnection path BS23 is open, the bit line BL2 and the bit line BL3 are decoupled. However, when the switchable bit line interconnection path BS23 is closed, the bit line BL2 and the bit line BL3 are interconnected and thus essentially operate as a merged bit line.

The switchable bit line interconnection path BL34 is connected between the bit line BL3 and the bit line BL4. The switchable bit line interconnection path BL34 is configured to selectively interconnect the bit line BL3 and the bit line BL4. As such, when the switchable bit line interconnection path BL34 is open, the bit line BL3 and the bit line BL4 are decoupled. However, when the switchable bit line interconnection path BL34 is closed, the bit line BL3 and the bit line BL4 are interconnected and thus essentially operate as a merged bit line.

The switchable bit line interconnection path BS45 is connected between the bit line BL4 and the bit line BL5. The switchable bit line interconnection path BS45 is configured to selectively interconnect the bit line BL4 and the bit line BL5. As such, when the switchable bit line interconnection path BS45 is open, the bit line BL4 and the bit line BL5 are decoupled. However, when the switchable bit line interconnection path BS45 is closed, the bit line BL4 and the bit line BL5 are interconnected and thus essentially operate as a merged bit line.

The switchable bit line interconnection path BS56 is connected between the bit line BL5 and the bit line BL6. The switchable bit line interconnection path BS56 is configured to selectively interconnect the bit line BL5 and the bit line BL6. As such, when the switchable bit line interconnection path BS56 is open, the bit line BL5 and the bit line BL6 are decoupled. However, when the switchable bit line interconnection path BS56 is closed, the bit line BL5 and the bit line BL6 are interconnected and thus essentially operate as a merged bit line.

The switchable bit line interconnection path BSY-1Y is connected between the bit line BLY-1 (not explicitly shown in FIG. 12) and the bit line BLY. The switchable bit line interconnection path BSY-1Y is configured to selectively interconnect the bit line BLY-1 and the bit line BLY. As such, when the switchable bit line interconnection path BSY-1Y is open, the bit line BLY-1 and the bit line BLY are decoupled. However, when the switchable bit line interconnection path BSY-1Y is closed, the bit line BLY-1 and the bit line BLY are interconnected and thus essentially operate as a merged bit line.

In this manner, each of the word line interconnection paths WS and switchable bit line interconnection paths BS are configured to be opened and closed such that different combinations of the variable resistive elements R are selectively interconnected so that each of the subarrays of the variable resistive elements R provides a corresponding combined variable conductance that represents a corresponding matrix value of the matrix D. All of the subarrays thus provide combined variable conductances within the cross point resistive network 12 (i.e., the cross point resistive array in this embodiment), which represent the matrix D. In other words, each subarray represents a different matrix value. The resistive memory units are thus reconfigurable into any combination of variable resistive elements R such as, individual variable resistive elements R or such as 1×2, 1×3, 2×1, 2×2, 2×3, 3×1, 3×2, 3×3 subarrays of the variable resistive elements R. Selecting the appropriate implementation of subarrays could be done using scan cells, which allow post-fabrication tuning based on process variation data. This reconfigurability adds a great amount of flexibility that could optimize the number of variable resistive elements R (and thus the area and energy needed to represent a matrix value) in the subarrays versus accuracy requirements for a given application.

The peripheral digital computational circuitry 28 includes the switch control circuitry 70 (shown in FIG. 3) configured to open and close the switchable paths W/BS and thus select a particular combination of the subarrays. In this embodiment, the switch control circuitry 70 is configured to generate a switch control output 16. The switch control output 16 is operable to open and close the switchable paths W/BS. Thus, different permutations of the switch control output 72 may open and close different combinations of the switchable paths W/BS and thus provide different combinations of the variable resistive elements R in the subarrays that provide the variable resistive units.

For example, if all of the switchable paths W/BS are opened, then the variable resistive units are selected to be individual variable resistive elements R. As such, the variable conductance of every one of the variable resistive elements R will represent a different matrix value of the matrix D. Thus, the integer number m will equal the integer number X, and the integer number p will equal the integer number Y. In this case, to perform the different matrix operations, the word line output includes each of the word line voltages VW1, VW2, VW3, VW4, VW5, VW6, VWX (referred to generically as word line voltages VW), and the bit line output includes all of the bit line voltages VB1, VB2, VB3, VB4, VB5, VB6, VBY, as described above with respect to the resistive memory system 10 shown in FIG. 1.

Referring again to FIG. 12, different patterns of the words lines WL and different patterns of the bit lines BL may be interconnected so that different sized subarrays are provided to create combined variable conductances that represent the matrix values of the matrix D when the integer number m and the integer number p are changed. However, if at least some of the switchable paths W/BS are closed so that the subarrays include blocks of the variable resistive elements R with multiple resistive elements R, then the integer number m and the integer number p will depend on the size of the subarrays. It should be noted that for the sake of explanation, a particular implementation is discussed with respect to FIG. 12 where the variable resistive units are selected to be 3×3 subarrays of the variable resistive elements R. Clearly, this is simply exemplary as the variable resistive units can be selected by the peripheral digital computational circuitry 28 to be subarrays of the variable resistive elements R of any size. The concepts, methods, and techniques described with respect to the 3×3 subarrays are equally applicable regardless of the size of the subarrays selected to provide the variable resistive units.

Every mutually exclusive set of three adjacent word line switches WS and every mutually exclusive set of three adjacent bit line switches BS can be opened and closed in accordance with a pattern that provides the variable resistive units as the 3×3 subarrays of the variable resistive elements R. In accordance with the pattern, the first and the second word line switches WS of the three adjacent word line switches WS are closed, and the third word line switch WS of the three adjacent word line switches is opened. Furthermore, the first and the second bit line switches BS in the three adjacent switches BS are closed, and the third bit line switch BS of the three adjacent switches is open. By following the pattern for every mutually exclusive set of three adjacent word lines switches WS and for every mutually exclusive set of three adjacent bit line switches, the variable resistive units are selected to be 3×3 subarrays of the variable resistive elements. To illustrate, when following the above mentioned pattern, the word line switches WS12, WS23 would be closed, and the word line switch WS34 would be opened. Similarly, the bit line switches 6S12, BS23 would be closed, and the word line switch BS34 would be opened. Accordingly, the word lines WL1, WL2, WL3 would be interconnected while the word line WL4 is decoupled from the word lines WL1, WL2, WL3 and the bit lines BL1, BL2, BL3 would be interconnected while the bit line BL4 would be decoupled from the bit lines BL1, BL2, BL3, Each of the matrix values of the matrix D are represented by a different corresponding one of the combined variable conductances provided by the other 3×3 subarrays that are not interconnected to the bit line BLY. Thus, when the variable resistive units are 3×3 subarrays of the variable resistive elements R, the combined variable conductances of a column of the 3×3 subarrays interconnected to the bit line BL3 represent a corresponding column of the matrix values of the matrix D. Additionally, the combined variable conductances of a column of the 3×3 subarrays interconnected to the bit line BL6 represent another corresponding column of the matrix values of the matrix D.

The column of the 3×3 subarrays interconnected to the bit line BL3 includes a 3×3 subarray having the variable resistive elements R11, R12, R13, R21, R22, R23, R31, R32, R33, a 3×3 subarray having the variable resistive elements R41, R42, R43, R51, R52, R53, R61, R62, R63, and a 3×3 subarray having the variable resistive elements RX-21 (not explicitly shown in FIG. 12), RX-22 (not explicitly shown in FIG. 12), RX-23 (not explicitly shown in FIG. 12), RX-11 (not explicitly shown in FIG. 12), RX-12 (not explicitly shown in FIG. 12), RX-13 (not explicitly shown in FIG. 12), RX1, RX2, RX3. Each of combined variable conductances of the 3×3 subarrays interconnected to the bit line BL3 represent a corresponding one of the matrix values in the corresponding column of the matrix D. During a D·Z operation, the column of the 3×3 subarrays interconnected to the bit line BL3 is configured to generate the bit line current IR3.

Additionally, the column of the 3×3 subarrays interconnected to the bit line BL6 includes a 3×3 subarray having the variable resistive elements R70, R15, R16, R24, R25, R26, R34, R35, R36, a 3×3 subarray having the variable resistive elements R44, R45, R46, R54, R55, R56, R64, R65, R66, and a 3×3 subarray having the variable resistive elements RX-24 (not explicitly shown in FIG. 12), RX-25 (not explicitly shown in FIG. 12), RX-26 (not explicitly shown in FIG. 12), RX-11 (not explicitly shown in FIG. 12), RX-15 (not explicitly shown in FIG. 12), RX-16 (not explicitly shown in FIG. 12), RX4, RX5, RX6. Each of combined variable conductances of the 3×3 subarrays interconnected to the bit line BL6 represent a corresponding one of the matrix values in the corresponding column of the matrix D. During a D·Z operation, the column of the 3×3 subarrays interconnected to the bit line BL6 is configured to generate the bit line current IR6.

The set of variable resistive units interconnected to the bit line BLY are configured to generate the correction line current IRY on the conductive line BLY. As with the embodiment shown in FIG. 1, the correction line current IRY in FIG. 12 is used to correct the effects of the non-zero minimum conductance state of each of the columns of the variable resistive units not connected to the bit line BLY. For example, when the variable resistive units are 3×3 subarrays of the variable resistive elements R, the column of the 3×3 subarrays interconnected to the bit line BLY are configured to generate the correction line current IRY on the bit line BLY. Thus, when the variable resistive units are 3×3 subarrays of the variable resistive elements R, the column of the variable resistive units interconnected to the bit line BLY includes a 3×3 subarray having the variable resistive elements R1Y, R1Y-1 (not explicitly shown in FIG. 12), R1Y-2 (not explicitly shown in FIG. 12), R2Y, R2Y-1 (not explicitly shown in FIG. 12), R2Y-2 (not explicitly shown in FIG. 12), R3Y, R3Y-1 (not explicitly shown in FIG. 12), R3Y-2 (not explicitly shown in FIG. 12), a 3×3 subarray having the variable resistive elements R4Y, R4Y-1 (not explicitly shown in FIG. 12), R4Y-2 (not explicitly shown in FIG. 12), R5Y, R5Y-1 (not explicitly shown in FIG. 12), R5Y-2 (not explicitly shown in FIG. 12), R6Y, R6Y-1 (not explicitly shown in FIG. 12), R6Y-2 (not explicitly shown in FIG. 12), and a 3×3 subarray having the variable resistive elements RX-2Y (not explicitly shown in FIG. 12), RX-2Y-1 (not explicitly shown in FIG. 12), RX-2Y-2 (not explicitly shown in FIG. 12), RX-1Y (not explicitly shown in FIG. 12), RX-1Y-1 (not explicitly shown in FIG. 12), RX-1Y-2 (not explicitly shown in FIG. 12), RXY, RXY-1 (not explicitly shown in FIG. 12), RXY-2 (not explicitly shown in FIG. 12).

During a D·Z operation, the column of 3×3 subarrays interconnected to the bit line BLY is configured to generate the correction line current IRY. Prior to the D·Z operation, the peripheral digital computational circuitry 28 is configured to provide each of the combined variable conductances of the 3×3 subarrays in the minimum conductance state. The correction line current IRY is used to virtually eliminate the effect of off state conductance in the columns of the 3×3 subarrays not interconnected to the bit line BLY, such as the column of the 3×3 subarrays interconnected to the bit line BL3 and the column of the 3×3 subarrays interconnected to the bit line BL6.

Thus, different combinations of the words lines WL and the bit lines BL may be opened and closed so that different sized subarrays are provided to create combined variable conductances that represent the matrix values of the matrix D when the integer number m and the integer number p are changed. However, the matrix operations are be performed where the word line output will represent vectors having a number of vector values that match the integer number p, and the bit line output will represent vectors having a number of vector values that match the integer m plus. As such, the word line output will include a proper subset of the word line voltages VW1, VW2, VW3, VW4, VW5, VW6, VWX (referred to generically as word line voltages VW), and the bit line output will include a proper subset of the bit line voltages VB1, VB2, VB3, VB4, VB5, VB6, VBY in accordance with the size of the subarrays. Furthermore, for a D·Z read operation, a proper subset of the resultant bit line currents IR1, IR2, IR3, IR4, IR5, IR6 are provided to a proper subset of the bit line controllers 24-1, 24-2, 24-3, 24-4, 24-5, 24-6.

To do this, the resistive memory system 10 includes word line switches (referred to generically as word line switches SW and specifically as word line switches SW1-SWX) connected between a corresponding one of the word line controllers 22 and a corresponding one of the word lines WL and bit line switches (referred to generically as bit line switches BW and specifically as word line switches SB1-SBY) connected between a corresponding one of the bit line controllers 24 and a corresponding one of the bit lines BL. More specifically, the word line switch SW1 is connected between the word line controllers 22-1 and the word line WL1. The word line switch SW2 is connected between the word line controllers 22-2 and the word line WL2. The word line switch SW3 is connected between the word line controllers 22-3 and the word line WL3. The word line switch SW4 is connected between the word line controllers 22-4 and the word line WL4. The word line switch SW5 is connected between the word line controllers 22-5 and the word line WL5. The word line switch SW6 is connected between the word line controllers 22-6 and the word line WL6. The word line switch SWX is connected between the word line controllers 22-X and the word line WL.

With respect to the bit line control circuitry 20, the bit line switch SB1 is connected between the bit line controller 24-1 and the bit line BL1. The bit line switch SB2 is connected between the bit line controller 24-2 and the bit line BL2. The bit line switch SB3 is connected between the bit line controller 24-3 and the bit line BL3. The bit line switch SB4 is connected between the bit line controller 24-4 and the bit line BL4. The bit line switch SB5 is connected between the bit line controller 24-5 and the bit line BL5. The bit line switch SB6 is connected between the bit line controller 24-6 and the bit line BL6. The bit line switch SBY is connected between the bit line controller 24-Y and the bit line BLY.

The switch control circuitry 70 shown in FIG. 3 is configured to open and close each of the word line switches SW and each of the bit line switches SB is configured to be opened and closed. In this manner, the switch control circuitry 70 is configured to generate a switch control output 72 that is configured to open and close the word line switches SW and the bit line switches SB based on the size of the subarrays selected by the switch control output 72. As such, the word line controllers 22 are interconnected by the word line switches SW to the word lines WL so that one of the word line controllers 22 is provided per row of subarrays while the remainder of the word line controllers 22 per row of subarrays are decoupled by the word line switches SW. The bit line controllers 24 are interconnected by the bit line switches SB to the bit lines BL so that one of the bit line controllers 24 is provided per column of subarrays while the remainder of the bit line controllers 24 per column of subarrays are decoupled by the bit line switches SB.

For instance, when 3×3 subarrays are provided by opening and closing the word line switches SW and the bit line switches SB in accordance with the pattern for every mutually exclusive set of three adjacent the word line switches WS and the bit line switches BS described above, then the word line control circuitry 18 provides the word line output with one of the word line voltages VW for every three interconnected word lines WL, and the bit line control circuitry 20 provides the bit line output with one of the bit line voltages VB for every three interconnected bit lines BL. Thus, when the variable resistive units are 3×3 subarrays of the variable resistive elements R, the switch control circuitry 70 may close the word line switches SW1, SW4, SWX and open the word line switches SW2, SW3, SW5, SW6. Furthermore, the switch control circuitry 70 may close the bit line switches SB3, SB6, SBY and open the bit line switches SB2, SB3, SB5, SB6. As such, the word line output will include the word line voltages VW3, VW6, VWX but not the word line voltages VW1, VW2, VW4, VW5. The bit line output will include the bit line voltages VB3, VB6, and VBY but not the bit line voltages VB1, VB2, VB4, VB5. Furthermore, for a D·Z read operation, the bit line currents IR3, IR6, IRY are provided to the bit line controllers 24-3, 24-6, 24-Y but not the bit line currents IR1, IR2, IR4, IR5 to the bit line controllers 24-1, 24-2, 24-4, 24-5.

By using the correction line current IRY, the resistive memory system 10 shown in FIG. 12 is configured to reduce or even eliminate the effect of the off conductance state when the variable resistive units are provided as multiple variable resistive elements. More specifically, the peripheral digital computational circuitry 28 is configured to provide a set of the variable resistive units so that the combined variable conductances of each of the variable resistive units in the set are provided in the minimum conductance state. In particular, the peripheral digital computational circuitry 28 is configured to provide a column of the variable resistive units interconnected to the bit line BLY so that the combined variable conductances of the variable resistive units interconnected to the bit line BLY are each provided in the minimum conductance state.

Each of the matrix values of the matrix D are represented by a different corresponding one of the combined variable conductances provided by the other 3×3 subarrays that are not interconnected to the bit line BLY. For example, each of the combined variable conductances of the column of the 3×3 subarrays interconnected to the bit line BL3 represent a corresponding one of the matrix values of the matrix D.

Each of the matrix values of the matrix D are represented by a different corresponding one of the combined variable conductances provided by the other 3×3 subarrays that are not interconnected to the bit line BLY. Thus, when the variable resistive units are 3×3 subarrays of the variable resistive elements R, the combined variable conductances of a column of the 3×3 subarrays interconnected to the bit line BL3 represent a corresponding column of the matrix values of the matrix D. During a D·Z operation, the column of 3×3 subarrays interconnected to the bit line BL3 are configured to generate the resultant bit line current IR3 on the bit line BL3 in response to the word line output representing Z. Additionally, the combined variable conductances of a column of the 3×3 subarrays interconnected to the bit line BL6 represent another corresponding column of the matrix values of the matrix D. During the D·Z operation, the column of 3×3 subarrays interconnected to the bit line BL6 are configured to generate the resultant bit line current IR6 on the bit line BL6 in response to the word line output representing Z.

Furthermore, during a D·Z operation, the set of variable resistive units interconnected to the bit line BLY are configured to generate the correction line current IRY on the conductive line BLY in response to the word line output representing Z. As with the embodiment shown in FIG. 1, the correction line current IRY in FIG. 12 is used to correct the effects of the non-zero minimum conductance state of each of the columns of the variable resistive units not connected to the bit line BLY. For example, when the variable resistive units are 3×3 subarrays of the variable resistive elements R, the column of the 3×3 subarrays interconnected to the bit line BLY are configured to generate the correction line current IRY on the bit line BLY. The correction line current IRY is used to virtually eliminate the effect of off state conductance in the columns of the 3×3 subarrays not interconnected to the bit line BLY, such as the column of the 3×3 subarrays interconnected to the bit line BL3 and the column of the 3×3 subarrays interconnected to the bit line BL6.

In accordance with the patterns of opening and closing of the switches SW, SB, WS, WB the bit line currents IR3, IR6, IRY are provided to the bit line controllers 24-3, 24-6, 24-Y but not the bit line currents IR1, IR2, IR4, IR5 to the bit line controllers 24-1, 24-2, 24-4, 24-5.

The bit line control circuitry 20 is coupled to receive the correction line current IRY and a proper subset of the resultant line currents IR1-IR6 from the bit lines BL. In accordance with the patterns of opening and closing of the switches SW, SB, WS, WB when the variable resistive units are 3×3 subarrays, the bit line currents IR3, IR6, IRY are provided to the bit line controllers 24-3, 24-6, 24-Y but not the bit line currents IR1, IR2, IR4, IR5 to the bit line controllers 24-1, 24-2, 24-4, 24-5. The bit line controller 24-3 is configured to receive the resultant bit line current IR3 on the bit line BL3 from the column of the 3×3 subarrays coupled to the bit line BL3. The bit line controller 24-3 is configured to generate the digital vector value that indicates a current level of the resultant bit line current IR3. The bit line controller 24-6 is configured to receive the resultant bit line current IR6 on the bit line BL6 from the column of the 3×3 subarrays coupled to the bit line BL6. The resultant bit line controller 24-6 is configured to generate a digital vector value that indicates a current level of the resultant bit line current IR6. Finally, the bit line controller 24-Y is configured to receive the correction bit line current IRY on the bit line BLY from the column of the 3×3 subarrays coupled to the bit line BLY. The resultant bit line controller 24-Y is configured to generate a digital correction value that indicates a current level of the correction bit line current IRY. Note that the digital vector values generated as a result of the resultant bit line current IR3, IR6 are off due to the off state conductance when received by the bit line controllers 24-3, 24-6 respectively.

The subtractor 26-3 is configured to subtract the digital correction value from the digital vector value 52-3 and generate a digital vector value equal to difference between the digital vector value from the read circuit of the bit line controller 24-3 and the digital correction value. The subtractor 26-6 is configured to subtract the digital correction value from the digital vector value 52-6 and generate a digital vector value equal to difference between the digital vector value from the read circuit of the bit line controller 24-6 and the digital correction value. The resultant digital vector values from the bit line controllers 24 are combined so that the bit line control circuitry 20 generates the resultant digital vector output 32. In this case, the resultant digital vector output 32 only includes the resultant digital vector values from the subtractors 26-3, 26-6. The resultant digital vector output 32 is received by the peripheral digital computational circuitry 28 to continue implementing the learning algorithm.

It should be noted that the pulse schemes for a D update operation described above with respect to FIGS. 8A-10B are implemented by the resistive memory system 10 shown in FIG. 12 in the same manner described above except that the pulses are applied to a variable resistive unit having multiple variable resistive elements in order to adjust the combined variable conductance from a current conductance state to a target conductance state. For example, in accordance with the patterns of opening and closing of the switches SW, SB, WS, WB which provide the variable resistive units as 3×3 subarrays, the pulse schemes can be applied to each of the 3×3 subarrays in the columns of 3×3 subarrays interconnected to the bit lines BL3 and BL6. Finally, it should also be noted that while not specifically shown, alternative embodiments of the resistive memory system 10 can be provided where the variable resistive units are subarrays of multiple variable resistive elements R that are fixed instead of reconfigurable. Still other alternative embodiments may have some of the variable resistive units as fixed subarrays while other variable resistive units are reconfigurable.

Those skilled in the art will recognize improvements and modifications to the preferred embodiments of the present disclosure. All such improvements and modifications are considered within the scope of the concepts disclosed herein and the claims that follow.

What is claimed is:

1. Computational circuitry comprising:
   a cross point resistive network comprising conductive lines and variable resistive units coupled to the conductive lines such that the conductive lines and the variable resistive units form the cross point resistive network; and
   control circuitry coupled to the cross point resistive network and configured to:
   provide a potential across a first plurality of the variable resistive units such that the first plurality of the variable resistive units provides a line current;
   provide the potential across a second plurality of the variable resistive units such that the second plurality of the variable resistive units provides a correction line current; and
   calculate a corrected line current by subtracting the correction line current from the line current.

2. The computational circuitry of claim 1 wherein:
   the cross point resistive network is arranged such that the variable resistive units are arranged in columns of the variable resistive units;
   the first plurality of the variable resistive units is a first column of the columns of the variable resistive units; and
   the second plurality of the variable resistive units is a second column of the columns of the variable resistive units.

3. The computational circuitry of claim 2 wherein:
   each of the variable resistive units is configured to provide a variable conductance; and
   the variable conductance of each of the second plurality of the variable resistive units is provided in a minimum conductance state.

4. The computational circuitry of claim 3 wherein the variable conductance of each of the variable resistive units may be set to a plurality of conductance states between the minimum conductance state and a maximum conductance state.

5. The computational circuitry of claim 4 wherein the control circuitry is configured to set the variable conductance of each of the variable resistive units such that each of the variable resistive units represents a matrix value in a matrix.

6. The computational circuitry of claim 5 wherein the control circuitry is configured to set the variable conductance of each of the variable resistive units by providing at least one positive voltage pulse and at least one negative voltage pulse across each of the variable resistive units.

7. The computational circuitry of claim 6 wherein the at least one positive voltage pulse has a longer pulse duration than the at least one negative voltage pulse and the at least one positive voltage pulse has a voltage magnitude that is greater than a voltage magnitude of the at least one negative voltage pulse.

8. The computational circuitry of claim 6 wherein the at least one negative voltage pulse has a longer pulse duration than the at least one positive voltage pulse and the at least one negative voltage pulse has a voltage magnitude that is greater than a voltage magnitude of the at least one positive voltage pulse.

9. The computational circuitry of claim 5 wherein the control circuitry is configured to set the variable conductance of each of the variable resistive units by providing a plurality of voltage pulses across each of the variable resistive units, wherein a pulse duration of each of the plurality of voltage pulses depends on the conductance state.

10. The computational circuitry of claim 1 wherein a cross point resistive array comprises variable resistive elements such that the variable resistive units are each provided as a subarray of the variable resistive elements.

11. The computational circuitry of claim 1 wherein a cross point resistive array comprises variable resistive elements and wherein the cross point resistive array is configured such that the variable resistive units are reconfigurable such that each of the variable resistive units are reconfigurable to be different combinations of the variable resistive elements.

* * * * *